(12) United States Patent
Goto et al.

(10) Patent No.: US 6,841,989 B2
(45) Date of Patent: Jan. 11, 2005

(54) HALL-EFFECT CURRENT DETECTOR

(75) Inventors: Hirokazu Goto, Tokyo (JP); Akira Hasegawa, Sakado (JP); Koji Ohtsuka, Kawagoe (JP); Takashi Kato, Asaka (JP)

(73) Assignee: Sanken Electric Co, Ltd. (JP)

( * ) Notice: Subject to any disclaimer, the term of this patent is extended or adjusted under 35 U.S.C. 154(b) by 0 days.

(21) Appl. No.: 10/166,203

(22) Filed: Jun. 10, 2002

(65) Prior Publication Data
US 2002/0190703 A1 Dec. 19, 2002

(30) Foreign Application Priority Data

Jun. 15, 2001 (JP) ........................................ 2001-182246
Jun. 15, 2001 (JP) ........................................ 2001-182247

(51) Int. Cl.[7] ........................ G01R 15/20; G01R 33/07
(52) U.S. Cl. .................................. 324/117 H; 324/251
(58) Field of Search ........................ 324/117 H, 117 R, 324/127, 251, 252; 338/32 H; 327/511; 323/294; 257/425, E43.002; 29/825, 829

(56) References Cited

U.S. PATENT DOCUMENTS 5,041,780 A * 8/1991 Rippel .................... 324/117 H
5,694,103 A * 12/1997 Goodwin et al. ........... 336/178
6,184,679 B1 * 2/2001 Popovic et al. ............. 324/251
6,356,068 B1 * 3/2002 Steiner et al. ........... 324/117 H
6,462,531 B1 * 10/2002 Ohtsuka ................. 324/117 H
6,512,359 B1 * 1/2003 Tamai et al. ............ 324/117 R
6,515,468 B1 * 2/2003 Morimoto et al. ....... 324/117 H

FOREIGN PATENT DOCUMENTS

JP     2000-174357     6/2000

* cited by examiner

*Primary Examiner*—Ernest Karlsen
(74) *Attorney, Agent, or Firm*—Woodcock Washburn, LLP

(57) ABSTRACT

A current detector comprising a current-path conductor assembly and a Hall generator assembly. The current-path conductor assembly includes a sheet-metal current-path conductor and a plastic conductor holder molded in one piece therewith. The Hall generator assembly includes a Hall generator in the form of a semiconductor chip mounted to a metal-made mounting plate, a set of leads electrically connected to the Hall generator, and a plastic encapsulation enveloping the Hall generator and parts of the leads. The Hall generator assembly and the current-path conductor assembly are combined by bonding together the encapsulation of the Hall generator assembly and the conductor holder of the current-path conductor assembly. The conductor holder and the encapsulation are shaped in interfitting relationship to each other, so that when they are united, the Hall generator is positioned to generate a Hall voltage in response to a magnetic field due to the current flowing through the current-path conductor.

13 Claims, 22 Drawing Sheets

HALL-EFFECT CURRENT DETECTOR

BACKGROUND OF THE INVENTION

This invention relates to a current detector for detection or measurement of electric current flowing in an electric circuit, and more specifically to such a detector incorporating a Hall-effect device more generally known also as Hall generator.

The Hall generator is built upon the familiar Hall effect to develop a voltage, known as Hall voltage, in proportion to the strength of the magnetic field applied. The Hall generator therefore lends itself to use as a magnetism detector. Additionally, positioned contiguous to a path of electric current, the Hall generator will put out a voltage indicative of the magnitude of the current by being acted upon by the magnetic field appearing in proportion to the current magnitude. The closer the Hall generator is positioned to the current path, the higher will be its sensitivity of current detection.

The instant applicant proposed in Japanese Unexamined Patent Publication No. 2000-174357 a current detector employing a Hal generator. This prior art device was designed explicitly for high detection sensitivity. To this end a current-path conductor layer for the flow of electric current to be detected was laid, via an insulating film, over a semiconductor substrate having a Hall generator formed therein. The prior art device has later proved to have some shortcomings.

The first of such shortcomings arises from the fact that the prior art current detector had to be wholly enveloped in a unitary encapsulation by reason of its very construction. The integral construction, from an early stage of manufacture, of the current-path conductor and the Hall generator is objectionable because the complete device has to be discarded for a defect associated with either the current-path conductor and the Hall generator, resulting in low productivity per unit of effort. A drastic increase in productivity is certain to occur if the current-path conductor and the Hall generator are manufactured in separate assemblies that can be put together in the final stage of manufacture.

Another weakness is the difficulty of assuring consistently high sensitivity and reliability for all the models manufactured. This difficulty has been found attributable to the fact that the positional relationship between the current-path conductor and the Hall generator is prone to fluctuation from model to model. Additionally, the conductor layer of the prior art device could tolerate current of only 10 amperes or so. There has therefore been awaited the advent of a device that can be put to use for detection of current of much greater magnitude, 100 to 600 amperes for instance, without sacrifice in sensitivity or in immunity to noise.

SUMMARY OF THE INVENTION

The present invention aims at improvement of the productivity of the current detector of the kind defined.

Another object of the invention is to enable mass production of current detector models that are invariably high in sensitivity, with a minimum of performance fluctuations.

Another object of the invention is to realize higher-sensitivity detection of current of much greater magnitude than has so far been possible with the prior art current detector of the kind defined.

Still another object of the invention is to improve the noise immunity of such mass-producible, high-sensitivity, large-current detector.

Still another object of the invention is to expedite the manufacture of such high-sensitivity, noise-immune, large-current detector.

Briefly, the invention may be summarized as a current detector utilizing the Hall-effect for detection or measurement of electric current. Included is a Hall generator for generating a Hall voltage proportional to the strength of an applied magnetic field. For carrying the current to be detected or measured, a current-path conductor is disposed adjacent the Hall generator in order to cause the same to generate the Hall voltage in response to a magnetic field due to the current flowing through the current-path conductor. A casing of electrically insulating material envelopes at least parts of all of the Hall generator and the current path conductor, holding the same in prescribed relative positions. Preferably, the Hall generator is mounted to a metal-made mounting plate.

Having the Hall generator, preferably fabricated in the form of a semiconductor chip, affixed thereto, the metal-made mounting plate functions both as a mechanical support for the chip and as a shield against noise due to external electric field or electromagnetic wave. The mounting plate serves the additional purpose of protecting the Hall generator from rupture particularly during connection of the leads thereto.

The current-path conductor should be of sheet metal for carrying current of desired high magnitude. The casing may be molded in one piece with the current-path conductor and the Hall generator so as to firmly hold these two components in prescribed positions. The sheet-metal current-path conductor may be cut into the shape of a U so as to extend a sufficient distance around the Hall generator for high-sensitivity detection of the current. The U-shaped current-path conductor may have slits cut inwardly from its outer edge so as to constrict the current path as it extends around the Hall generator. In this manner, although the current-path conductor may be wide enough to gain required degrees of heat dissipation and mechanical strength, there will be a concentrated flow of current around the Hall generator, resulting in an increase in the flux actually working thereon.

That surface of the metal-made mounting plate which has the Hall generator attached thereto may be directed either toward, or away from, the current-path conductor. With the Hall generator placed between mounting plate and current-path conductor, the mounting plate will most effectively serve as a noise shield. When itself disposed between Hall generator and current-path conductor, on the other hand, the mounting plate will function to reduce electrostatic noise from the conductor.

Preferably, for ease of fabrication and assemblage, the current detector may be constituted of a Hall generator assembly and a current-path conductor assembly. The Hall generator assembly may comprise the Hall generator, and a plastic encapsulation enveloping both Hall generator, leaving exposed at least parts of the Hall generator leads. The current-path conductor assembly may comprise the sheet-metal current-path conductor, and a plastic holder for the conductor molded in one piece therewith. The Hall generator assembly and the current-path conductor assembly may be combined by bonding together the encapsulation of the Hall generator assembly and the conductor holder of the current-path conductor assembly. The two assemblies may be prefabricated totally separately, and preferably concurrently, for most efficient manufacture of the current detector. The prefabrication of the two separate assemblies will be easier than the fabrication of the complete device without division into such assemblies.

It is also recommended that the plastic encapsulation of the Hall generator assembly and the plastic holder of the current-path conductor assembly be shaped in interfitting relationship to each other. In all the preferred embodiments of the invention to be disclosed subsequently, the Hall generator encapsulation and the current-path conductor holder are so shaped in relation to each other that when they are interfittingly put together, the Hall generator is correctly positioned relative to the current-path conductor. The correct relative positioning of the Hall generator and the current-path conductor is essential for precision measurement of large current.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

The first preferred form of current detector according to the invention, shown in FIGS. 1–14 of the above drawings, is specifically designed for use on electric-motor-powered vehicles. Pictured in its entirety and in completed form in FIGS. 1–4, the representative current detector is broadly divisible as in FIG. 5 into a current-path conductor assembly 1 and a Hall generator assembly 2, which are integrally joined together in prescribed positional relationship via an adhesive layer, seen at 3 in both FIGS. 2 and 3, at a final stage of manufacture of this current detector. The current-path conductor assembly 1 provides a path for the current to be detected or measured. The Hall generator assembly 2 includes a semiconductor chip with a Hall-effect device or Hall generator formed therein for generating a Hall voltage proportional to the magnitude of the current flowing through the current path of the current-path conductor assembly 1. The current-path conductor assembly 1 is shown by itself in FIG. 6, and the Hall generator assembly 2 in FIG. 7.

The current-path conductor assembly 1 comprises a sheet-metal current-path conductor 4, which provides the desired current path, and a molded-plastic conductor holder 5 molded in one piece with the current-path conductor. Preferably, the current-path conductor 4 is a punching of sheet copper, complete with a nickel plating, that is sufficiently thick to carry current of, say, 100 to 600 amperes.

Figure 8:
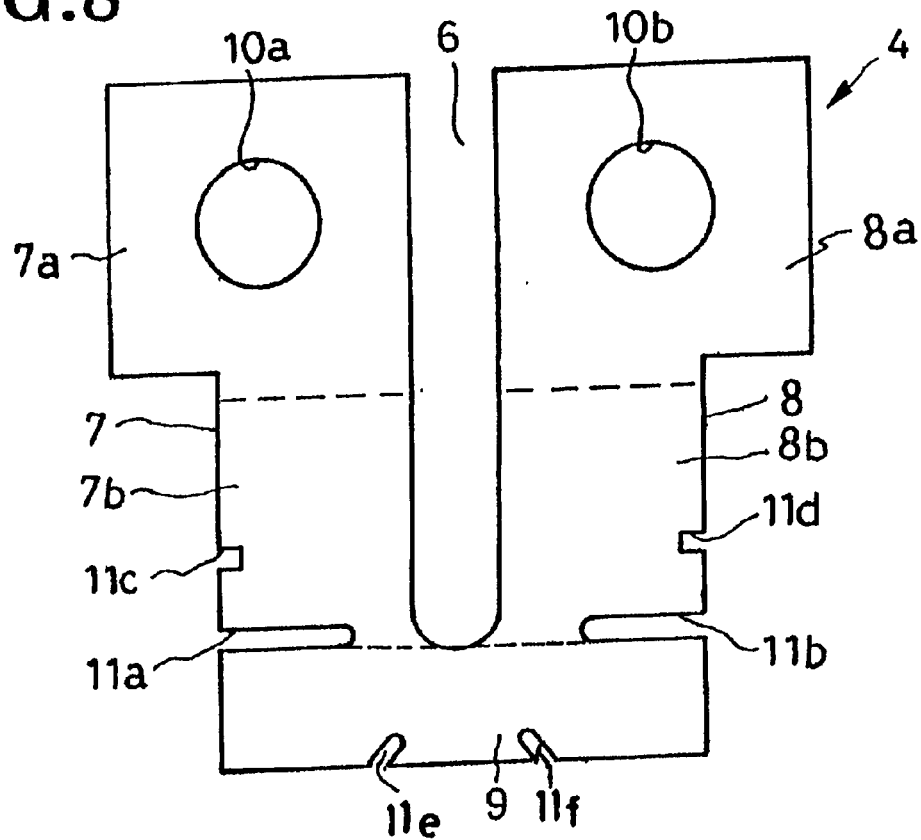
FIG. 8 is a plan view of the current-path conductor of the current-path conductor assembly of FIG. 6.

As best pictured in FIG. 8, the current-path conductor 4 is generally U-shaped in this particular embodiment as a relatively wide and deep slit 6 is cut therein, providing a pair of limbs 7 and 8 extending in parallel spaced relationship to each other, and a bight 9 joining the limbs each at one end thereof. The conductor limbs 7 and 8 are notionally subdivisible, as indicated by the broken lines in FIG. 8, into relatively enlarged distal or terminal portions $7_a$ and $8_a$, and current-path portions $7_b$ and $8_b$ through which the terminal portions are joined to the bight 9, another current-path portion. The terminal portions $7_a$ and $8_a$ of the conductor limbs 7 and 8 have bores $10_a$ and $10_b$ formed therein for use in fastening this current detector to a desired electric circuit to be tested.

The current-path portions $7_b$ and $8_b$ of the conductor limbs 7 and 8 are shown to have a pair of slits $11_a$ and $11_b$ and another pair of shorter slits $11_c$ and $11_d$, respectively, which are cut inwardly from their outer edges. An additional pair of slits $11_e$ and $11_f$ are shown formed in the bight 9 of the current-path conductor 4. All these pairs of slits are intended to constrict the current path toward the slit 6 between the limbs 7 and 8. Besides, in insert-molding the plastic holder 5 with the current-path conductor 4, the slit pairs will help establish firmer engagement of the conductor with the holder, resulting in greater mechanical strength of the current-path conductor assembly 1.

Figure 2:
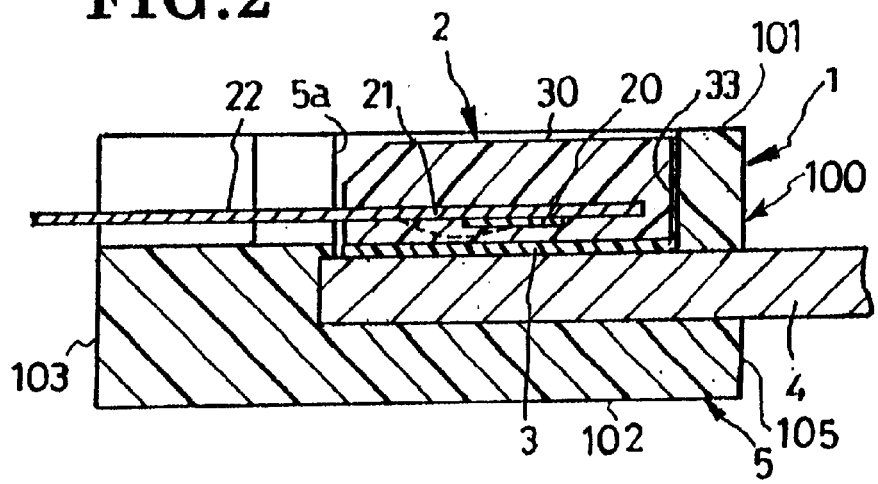
FIG. 2 is a section through the first preferred form of current detector, taken along the line II—II in FIG. 1.
Figure 3:
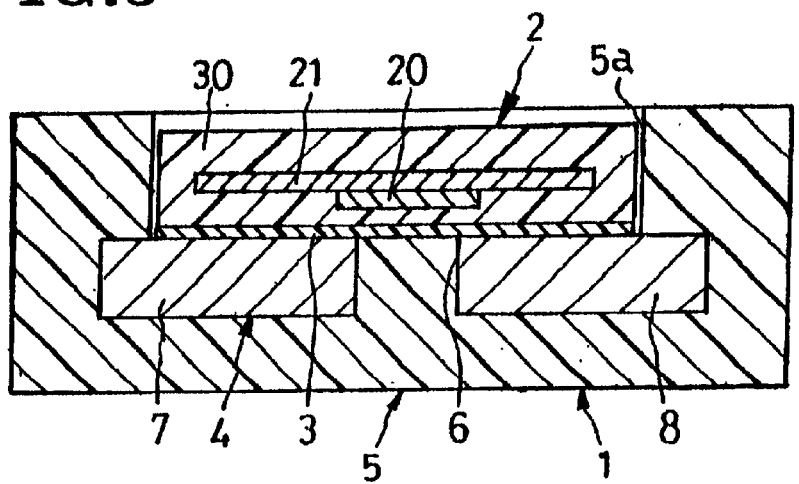
FIG. 3 is another section through the first preferred form of current detector, taken along the line III—III in FIG. 1.

The conductor holder 5 is designed for mechanically supporting and electrically insulating the current-path conductor 4, as well as for positioning the Hall generator assembly 2 with respect to the conductor 4 in putting together the current-path conductor assembly 1 and Hall generator assembly 2. Toward these ends the conductor holder 5 envelopes required part of the current-path conductor 4, leaving exposed the pair of terminal portions $7_a$ and $8_a$ and parts of the pair of current-path portions $7_b$ and $8_b$ and the bight 9. More specifically, as best seen in FIGS. 2 and 3, the conductor holder 5 covers nearly the complete bottom surfaces, as seen in these figures, and parts of the top surfaces, of the pair of current-path portions $7_b$ and $8_b$ and the bight 9, and fills part of the slit 6 between the pair of conductor limbs 7 and 8 and all of the slits $11_a$–$11_f$. As indicated in all of FIGS. 1–6, moreover, the conductor holder 5 has formed therein recesses or depressions $5_a$ and $5_b$ for receiving the Hall generator assembly 2 in prescribed positional relationship to the current-path conductor 4. More will be said presently about these positioning recesses $5_a$ and $5_b$. The conductor holder 5 of this shape can be easily formed in one piece with the current-path conductor 4 by the familiar transfer molding method or by injection.

Figure 7:
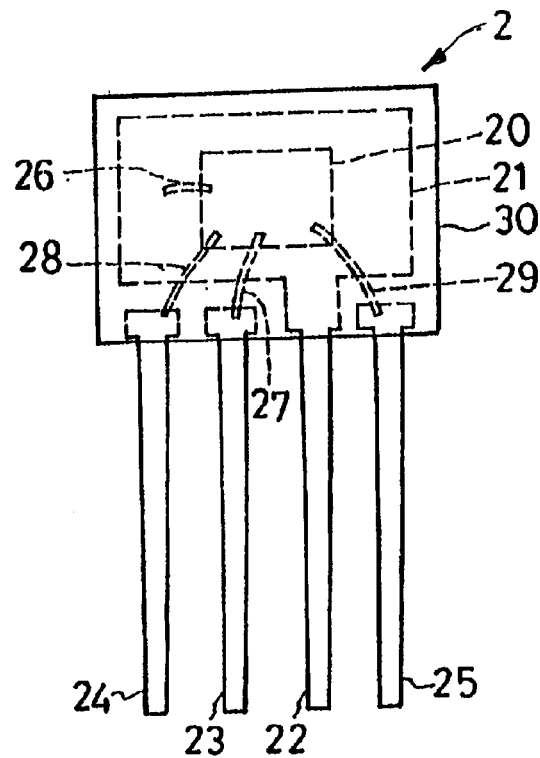
FIG. 7 is a plan view of the Hall generator assembly shown in FIG. 5.

With particular reference to FIG. 7 the Hall generator assembly 2 comprises a semiconductor chip 20 including a Hall-effect device or Hall generator, not shown in this figure, a metal-made mounting plate 21 for the chip, a lead 22 of one-piece construction with the mounting plate, three other leads 23, 24 and 25, and a plastic encapsulation 30 enveloping all of the semiconductor chip 20 and mounting plate 21 and all but most parts of the leads 22–25. The semiconductor chip 20 is of such design, as will be detailed later with reference to FIGS. 12–14, that the Hall generator assembly 2 has four leads 22–25. Of these, only the lead 22 is electrically coupled to the mounting plate 21 and thence to the semiconductor chip by a wire 26 of aluminum or like material, as will be seen also from FIG. 9 which shows the Hall generator assembly minus the encapsulation 30. The other leads 23–25 are connected directly to the semiconductor chip by way of wires 27, 28 and 29, respectively.

Figure 4:
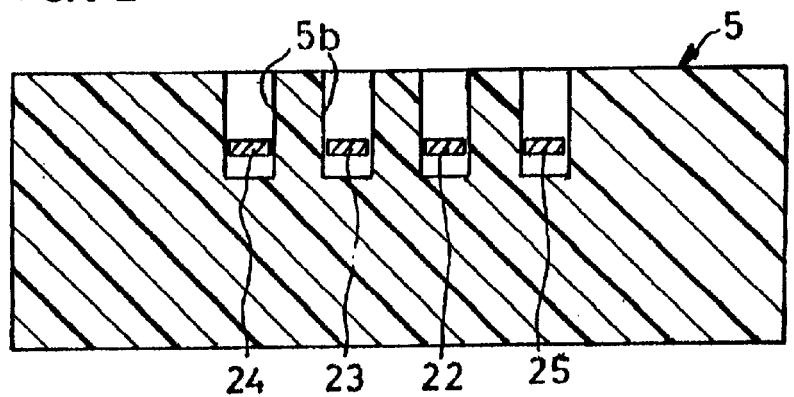
FIG. 4 is still another section through the first preferred form of current detector, taken along the line IV—IV in FIG. 1.
Figure 5:
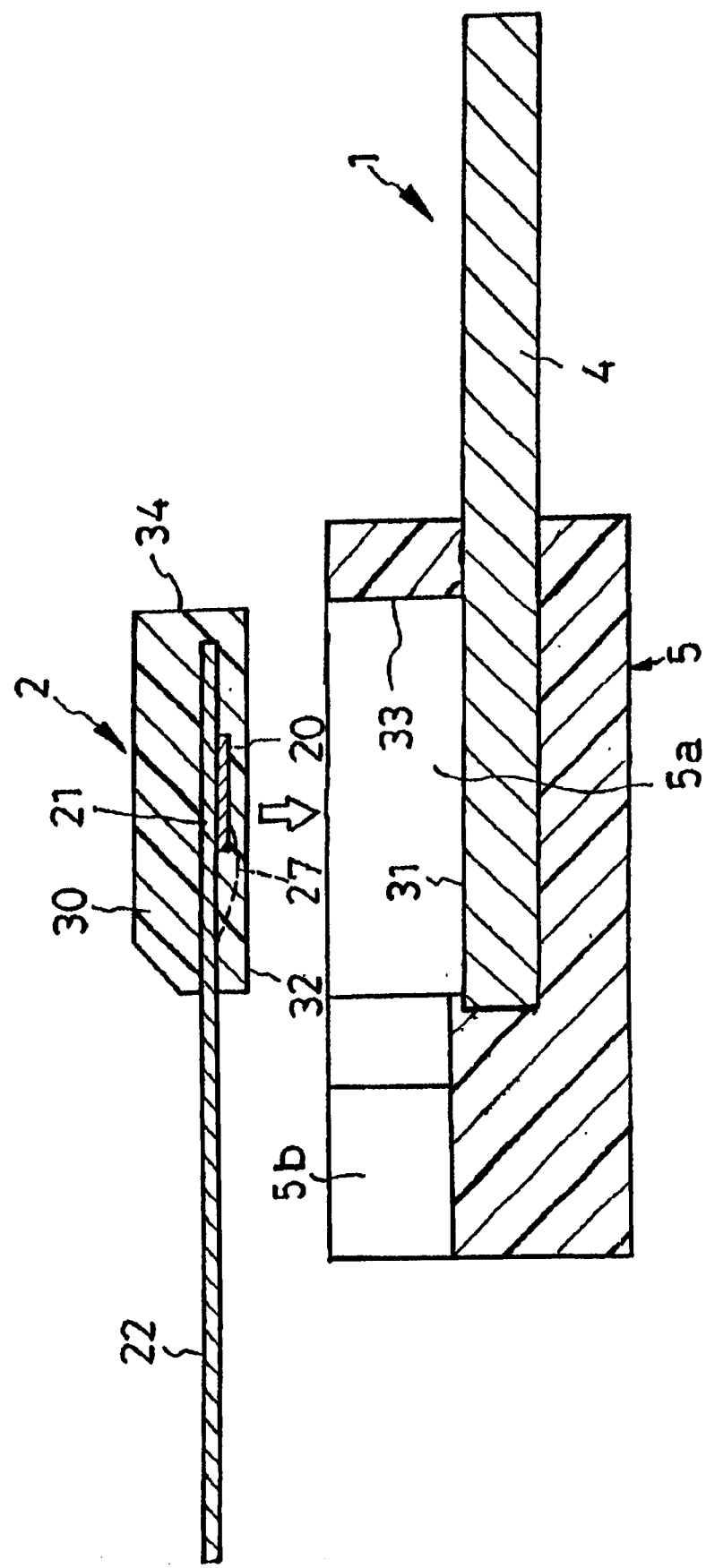
FIG. 5 is a view similar to FIG. 2 except that the current detector is shown divided into the Hall generator assembly and the current-path conductor assembly.
Figure 6:
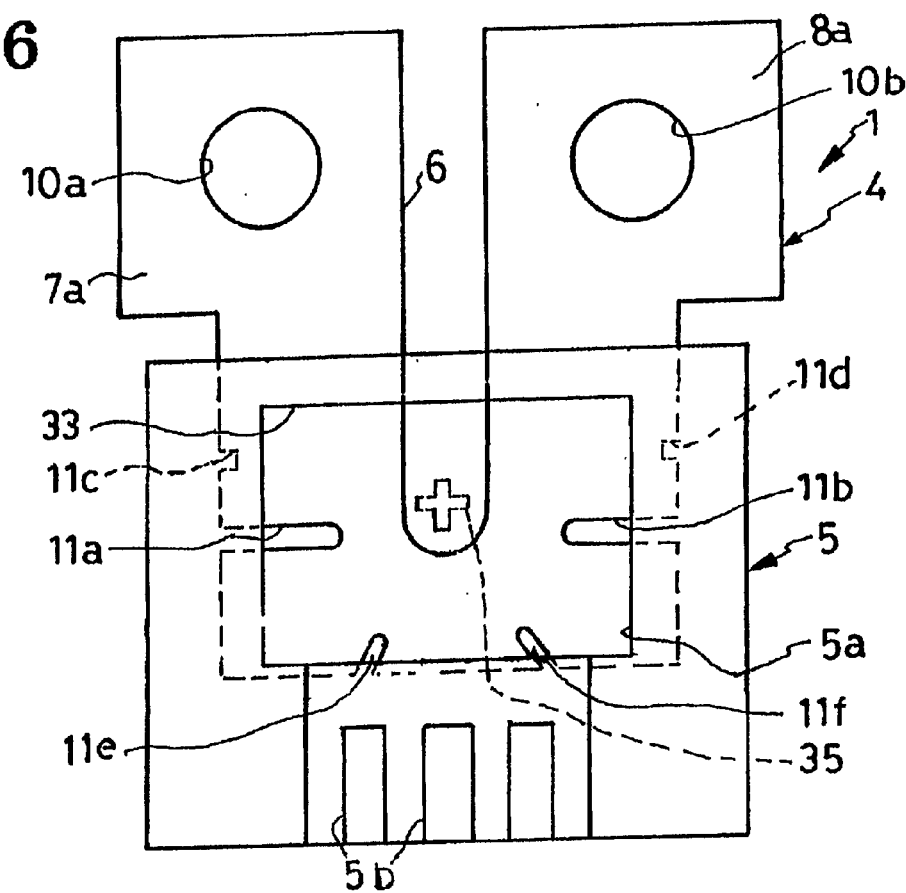
FIG. 6 is a plan view of the current-path conductor assembly shown in FIG. 5.

As indicated in FIG. 5, the encapsulation 30 of the Hall generator assembly 2 is generally box-shaped, with a size to fit in the positioning recess $5_a$ in the conductor holder 5 of the current-path conductor assembly 1. It will also be noted from this figure that the encapsulation 30 includes a bottom surface 32 held against the exposed surface portion 31 of the current-path conductor 4 of the current-path conductor assembly 1, and a side surface 34 held against the wall 33 defining the positioning recess $5_a$. The current-path conductor assembly 1 and the Hall generator assembly 2 are bonded together by the adhesive layer 3, FIG. 2, between the surface portion 31 of the current-path conductor 4 and the bottom surface 32 of the Hall generator encapsulation 30 and by another such layer between the wall surface 33 of the conductor holder 5 and the side surface 34 of the Hall generator encapsulation 30. Thus, as the plastic conductor holder 5 and Hall generator encapsulation 30 are integrally joined together as above, so are the current-path conductor assembly 1 and Hall generator assembly 2, completing the current detector as in FIGS. 1–4. Namely, the current-path conductor assembly 1 and the Hall generator assembly 2 are combined by joining together the conductor holder 5 of the current-path conductor assembly 1 and the encapsulation 30 of the Hall generator assembly 2 into a substantially unitary casing for the current detector. The conductor holder 5 and the encapsulation 30 are shaped in interfitting relationship to each other in such a way that when they are interfittingly united, the Hall generator 35 is so positioned relative to the current-path conductor 4 as to generate a Hall voltage in response to a magnetic field due to the current flowing through the current-path conductor 4.

Figure 1:
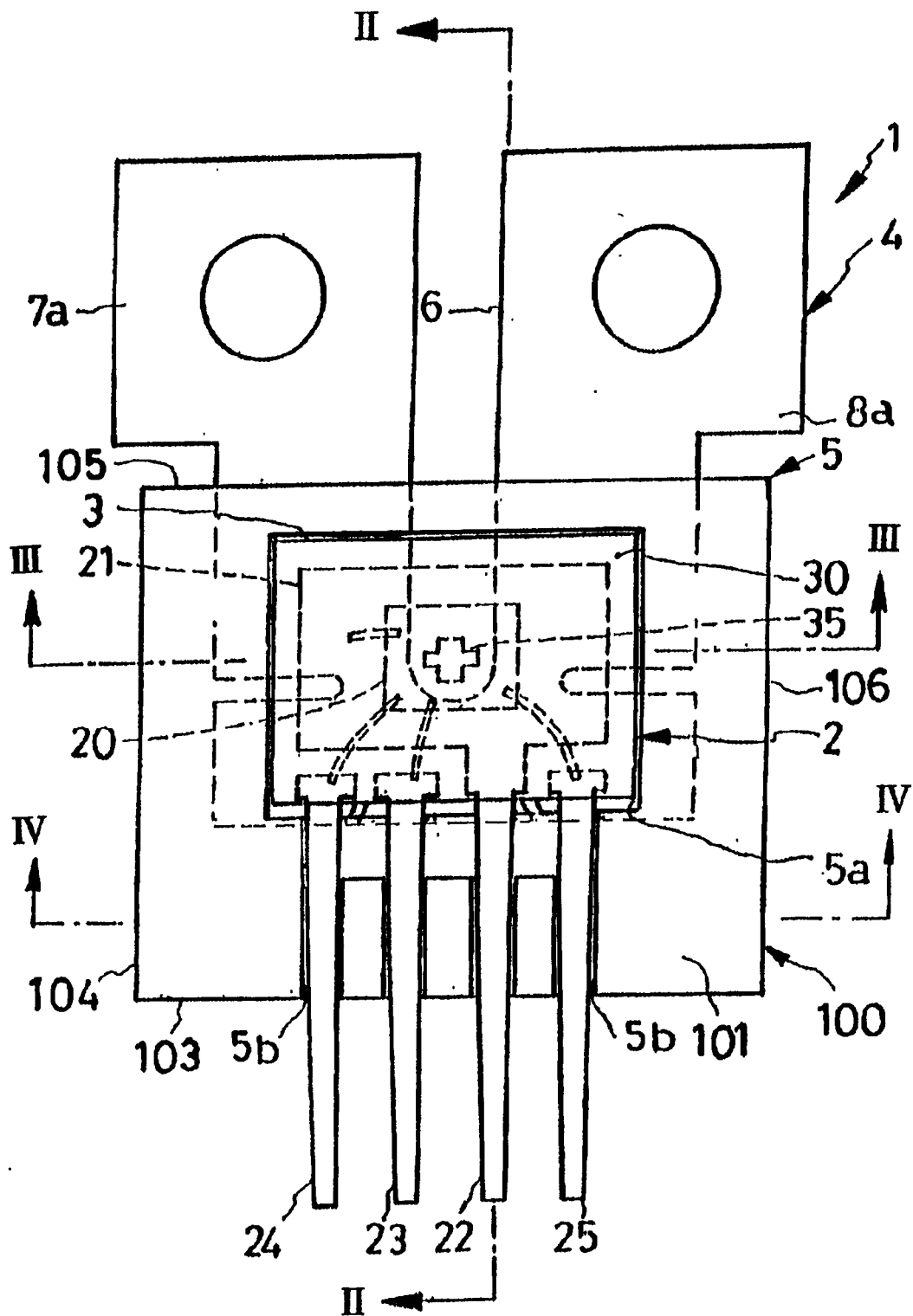
FIG. 1 is a plan view of a first preferred form of current detector according to the present invention.

Bonded to each other as in the foregoing, the conductor holder 5 and Hall generator encapsulation 30 constitute in combination a casing, designated 100 in FIG. 1, for this current detector. The casing 100 is approximately boxlike and, as seen in a plan view as in FIG. 1, square in shape. The pair of conductor terminal portions $7_a$ and $8_a$ of the current-path conductor assembly 1 project from the casing 100 in one direction, and the leads 22–25 of the Hall generator assembly 2 in the opposite direction. More specifically, and speaking somewhat broadly, the casing 100 is a six-sided solid having, as indicated in both FIGS. 1 and 2, a pair of opposite major surfaces 101 and 102 and four side surfaces 103, 104, 105 and 106. The pair of conductor terminal portions $7_a$ and $8_a$ project from the side surface 105 of the casing 100, and the Hall generator leads 22–25 from the side surface 103.

FIG. 4 clearly illustrates that the four Hall generator leads 22–25 are partly received respectively in the positioning recesses $5_b$ in the conductor holder 5 and thereby held in parallel spaced relationship to one another. The conductor holder 5 with the positioning recesses $5_b$ serves to prevent the leads 22–25 from mutual electrical contact as well as from mechanical deformation or displacement.

It will be observed from FIGS. 2–4 that the Hall generator assembly 2 with the leads 22–25 is received with clearances in the positioning recesses $5_a$ and $5_b$ in the conductor holder 5. Although the current-path conductor assembly 1 and Hall generator assembly 2 can be firmly united solely by the adhesive layer 3, it is recommended for still stronger union of the two assemblies 1 and 2 that a suitable adhesive resin be poured into the clearances for solidification in situ. The resin thus introduced into the clearances is shown at 90 in FIGS. 10 and 11.

Figure 12:
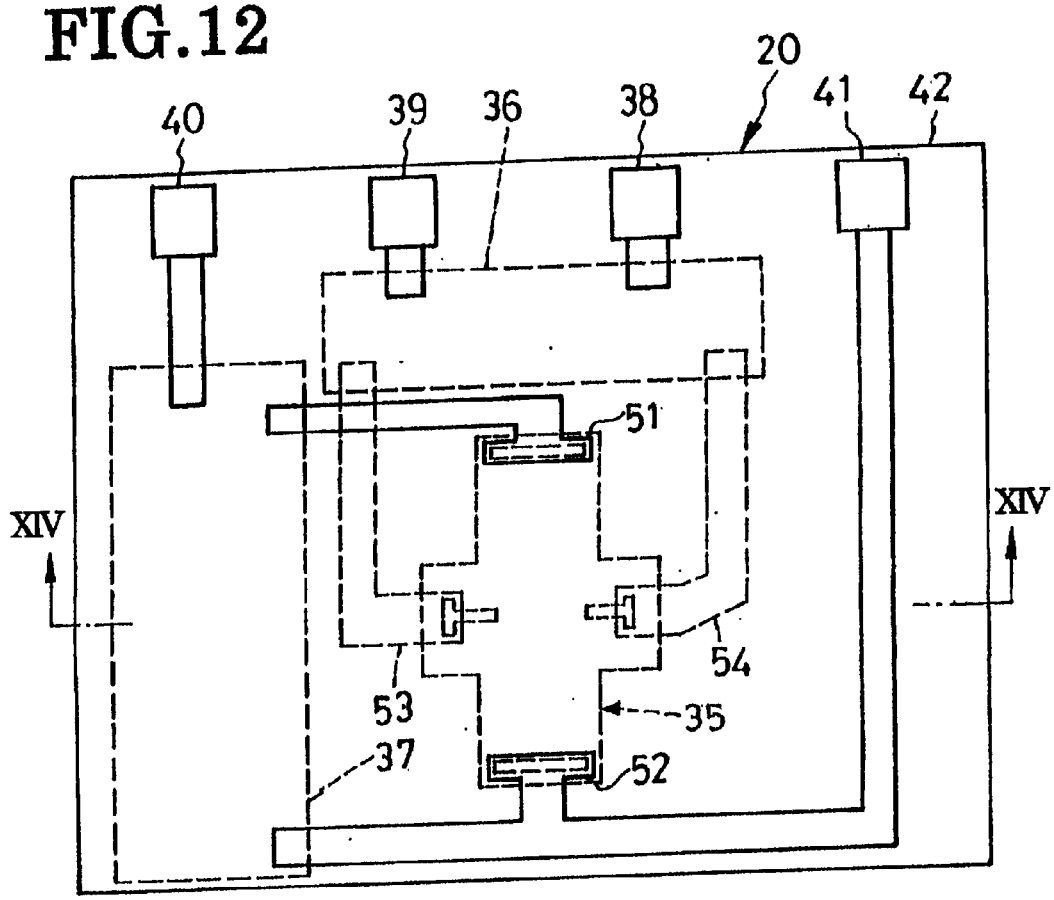
FIG. 12 is an enlarged bottom plan view of the semiconductor chip of the Hall generator assembly of FIGS. 7 and 9.

As illustrated in detail in FIG. 12, the semiconductor chip 20 comprises a Hall-effect device or Hall generator 35, an amplifier 36, and a control current supply circuit 37, which are all conventionally formed in a substrate 42 of semiconductor material (e.g. gallium arsenide or silicon). The construction of the semiconductor chip 20 is generally conventional, so that no more detailed illustration of the amplifier 36 and control current supply circuit 37 is considered necessary; only, the Hall generator 35 is shown in further detail in FIGS. 13 and 14 as it bears more or less direct pertinence to the various improvements that are introduced into this current detector by the instant invention.

Figure 13:
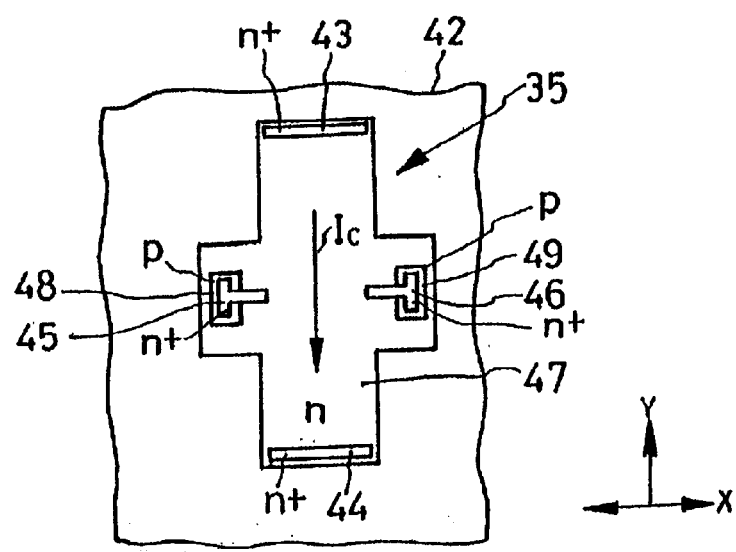
FIG. 13 is a fragmentary plan view showing in more detail the Hall generator included in the semiconductor chip of FIG. 12.
Figure 14:
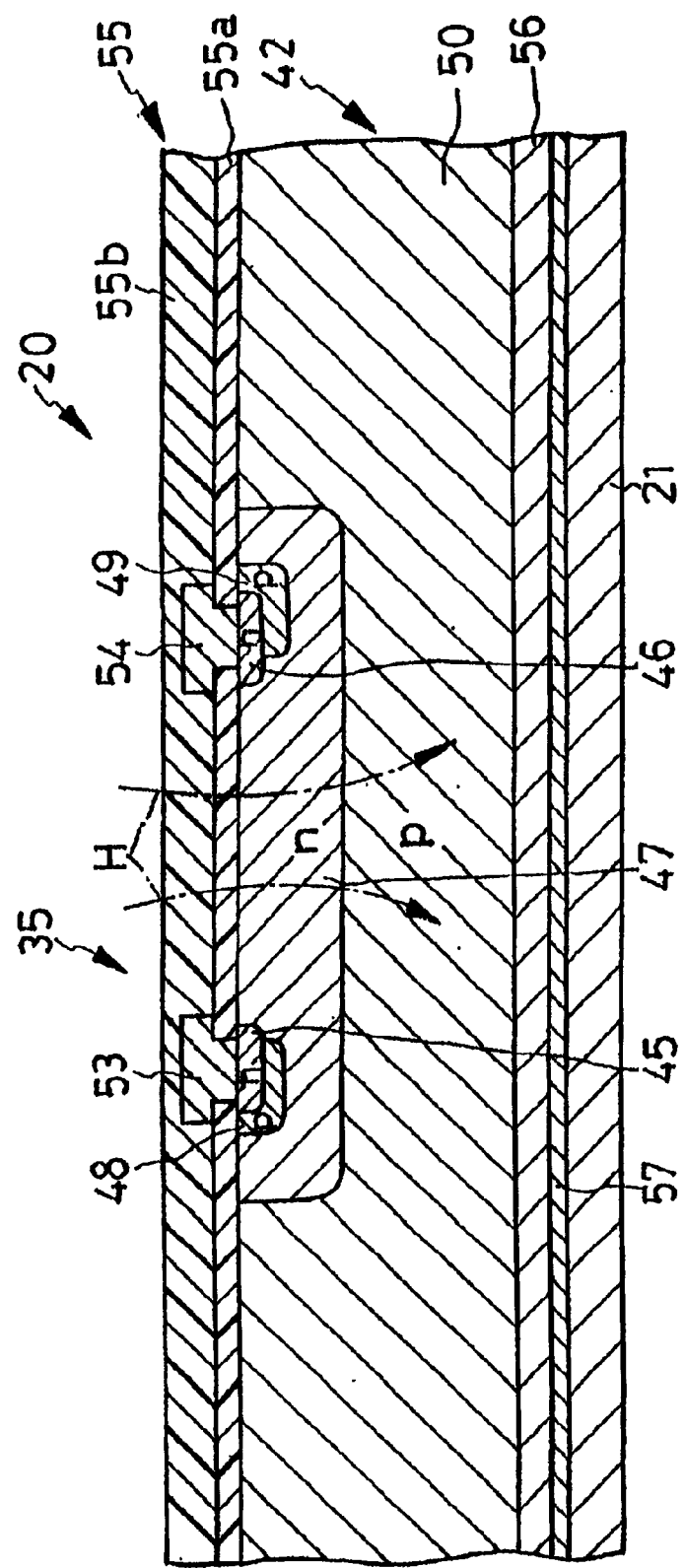
FIG. 14 is a still more enlarged, fragmentary section through the semiconductor chip including the Hall generator of FIG. 13, the section being taken along the line XIV—XIV in FIG. 12.

With reference to FIGS. 13 and 14 the Hall generator 35 is constituted of five n-type semiconductor regions 43, 44, 45, 46 and 47 and three p-type semiconductor regions 48, 49 and 50, which are all formed in the substrate 42 of square shape as seen in a plan view as in FIG. 12. The fifth n-type semiconductor region 47 is formed as an island, which is cross-shaped as seen in a plan view as in FIG. 13, in the third p-type semiconductor region 50 which occupies most part of the substrate 42. Higher in impurity concentration than this fifth n-type semiconductor region 47, the first and second n-type semiconductor regions 43 and 44 are both formed as islands in the region 47 with a spacing therebetween along the y-axis in FIG. 13. Electrodes 51 and 52, FIG. 12, are in ohmic contact respectively with the first and second n-type semiconductor regions 43 and 44. The electrodes 51 and 52 are both connected to the control current supply circuit 37 in order to cause control current $I_c$ to flow through the fifth n-type semiconductor region 47 from the first n-type semiconductor region 43 to the second 44. It is understood that the electrodes 51 and 52 are electrically connected via the control current supply circuit 37 to a pair of terminals 40 and 41, FIG. 12, thereby to be coupled to a direct current power supply, not shown.

Also higher in impurity concentration than the fifth n-type semiconductor region 47, the third and fourth n-type semiconductor regions 45 and 46 are formed adjacent the center of the fifth n-type semiconductor region 47 in the direction of the y-axis and spaced from each other in the direction of the x-axis for detection of the Hall voltage. These regions 45 and 46 are partly contiguous to the fifth n-type semiconductor region 47 and partly to the first and second p-type semiconductor regions 48 and 49. These p-type semiconductor regions 48 and 49 are intended to limit the areas of contact of the third and fourth n-type semiconductor regions 45 and 46 with the fifth n-type semiconductor region 47. Both FIGS. 12 and 14 indicate that electrodes 53 and 54 are in ohmic contact with the third and fourth n-type semiconductor regions 45 and 46. The electrodes 53 and 54 are both electrically coupled to the terminals 38 and 39 via the amplifier 36.

The Hall voltage will develop between the third and fourth n-type semiconductor regions 45 and 46 in proportion to the strength of the magnetic field applied normal to the flow of the control current $I_c$ from the first n-type semiconductor region 43 to the second 44. Thus the part of the fifth n-type semiconductor region 47 which lies between the first and second n-type semiconductor regions 43 and 44 and between the third and fourth n-type semiconductor regions 45 and 46 constitutes the "primary working part of the Hall generator 35," a term used in the claims appended hereto, in the narrower sense of the term. Speaking more broadly, however, this term may be construed to refer to the entire fifth n-type semiconductor region 47.

As shown also in FIG. 14, the semiconductor substrate 42 has an insulating layer 55, as of silicon oxide, formed on one major surface thereof and a metallic layer 56, as of aluminum, on the other major surface thereof. The insulating layer 55 takes the form of a lamination of two sublayers 55a and 55b for convenience in wiring. The electrodes 51 and 52, FIG. 12, are coupled to the first and second n-type semiconductor regions 43 and 44, respectively, via openings in the insulating sublayers 55a and 55b. The electrodes 53 and 54, FIG. 14, are coupled to the third and fourth n-type semiconductor regions 45 and 46, respectively, via openings in the insulating sublayer 55a. The metallic layer 56 on the other major surface of the substrate 42 is secured to the mounting plate 21, shown also in FIGS. 1–3 and so forth, via a bonding agent 57 which may be either electrically conductive or insulating.

Figure 9:
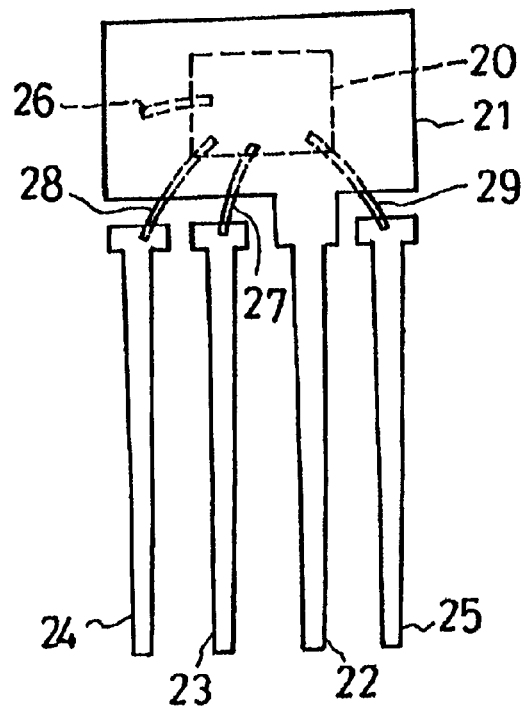
FIG. 9 is a plan view showing all but the plastic encapsulation of the Hall generator assembly of FIG. 7.
Figure 10:
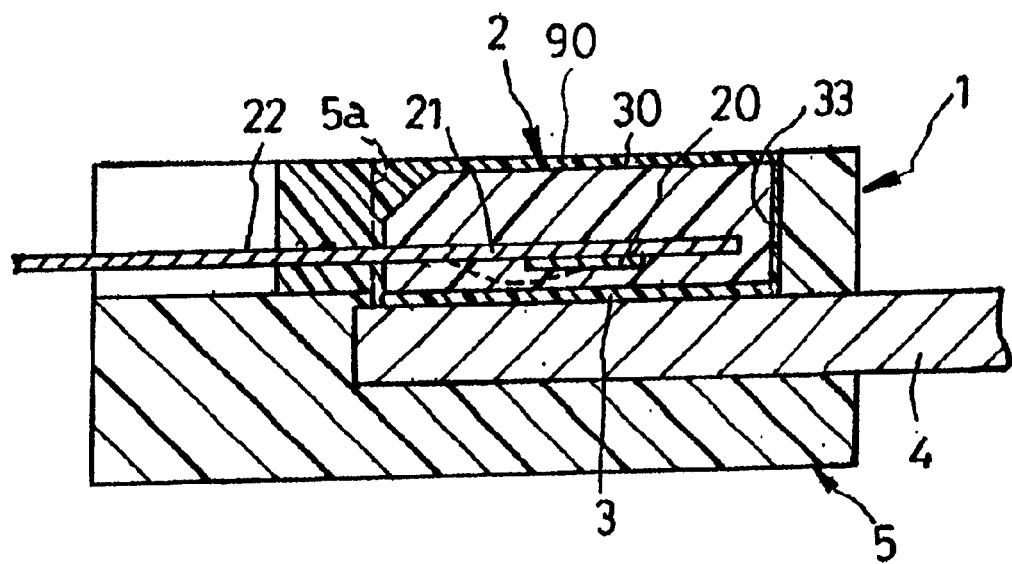
FIG. 10 is a view similar to FIG. 2 except that an additional amount of adhesive is shown used for uniting the current-path conductor assembly and the Hall generator assembly.
Figure 11:
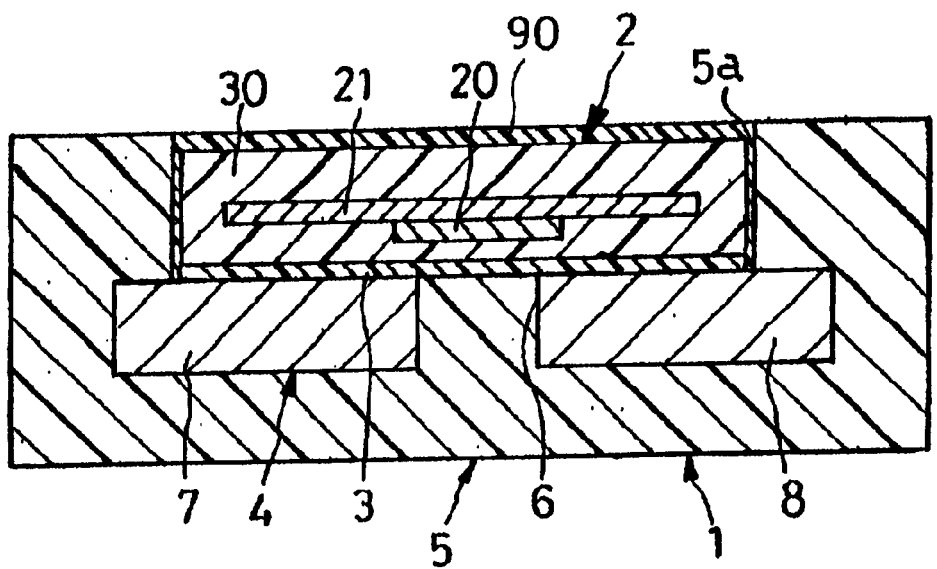
FIG. 11 is a view similar to FIG. 3 except for the showing of the additional amount of adhesive used as in FIG. 10.

FIG. 9 best indicates that the mounting plate 21 is generally rectangular in shape, with an area greater than that of the semiconductor chip 20. The mounting plate 21 and the four leads 22–25 are punchings made from the same sheet metal material such as sheet copper with a nickel plating, and are less in thickness than the current-path conductor 4. The mounting plate 21 is joined directly to the lead 22, which usually is grounded. Additionally, the mounting plate 21 is wired at 26 to the terminal 38, FIG. 12, of the semiconductor chip 20. The other terminals 39–41 of the semiconductor chip 20 are wired at 27–29 to the leads 23–25, respectively.

As will be noted by referring back to FIG. 1, the semiconductor chip 20 is so positioned on the mounting plate 21 that, as seen in a plan view as in this figure, most of the semiconductor chip is in register with the slit 6 between the pair of limbs 7 and 8 of the current-path conductor 4. More specifically, as indicated by the dashed lines in both FIGS. 1 and 6, at least the primary working part of the Hall generator 35 is contained in the slit 6 as seen in a plan view.

In use of this current detector, constructed as set forth hereinbefore with reference to FIGS. 1–14, the pair of terminals $7_a$ and $8_a$ of the current-path conductor 4 may be connected to the desired electric circuit so that the current to be detected or measured may flow through the U-shaped path of the conductor. Since this current path substantially encircles and closely adjoins the primary working part of the Hall generator 35, as seen in a plan view as in FIG. 1, the current flow through the conductor 4 will produce a magnetic field H, as indicated by the arrows in FIG. 14, effectively acting on the Hall generator. Oriented normal to the direction of the control current $I_c$ flowing through the n-type semiconductor region 47 of the Hall generator 35, the magnetic field H will give rise to the Hall voltage between the pair of n-type semiconductor regions 45 and 46, or between the pair of electrodes 53 and 54. This Hall voltage will be in proportion with the strength of the magnetic field H and hence with the magnitude of the current to be detected.

The following is a summary of the features of the FIGS. 1–14 current detector, together with the advantages accruing therefrom:

1. The current detector is separated into the current-path conductor assembly 1 and the Hall generator assembly 2, which are separately, and preferably concurrently, manufacturable. Moreover, for still higher production efficiency, the two assemblies may be tested separately, and only those assemblies which have proved to be in good working order may be put together to complete current detectors. The thus completed current detectors will be almost all faultless since all that is required to combine the two assemblies is the bonding of the current-path conductor holder 5 and the Hall generator encapsulation 30.

2. The conductor holder 5 of the current-path conductor assembly 1 has formed therein the positioning recesses or depressions $5_a$ for receiving the Hall generator assembly 2 in joining the two assemblies 1 and 2. The Hall generator 35 can thus be automatically positioned with respect to the current-path conductor 4.

3. The leads 22–25 of the Hall generator assembly 2 are also correctly positioned against the dangers of short-circuiting, deformation and displacement, by being received in the positioning recesses $5_b$ in the conductor holder 5.

4. Of sturdy sheet-metal construction, the current-path conductor 4 with its holder 5 is integrally united with the Hall generator assembly 2 in the completed current detector, enabling a current of as much magnitude as 100–600 amperes to flow in very close proximity of the Hall generator 35.

5. The current-path conductor 4 is U-shaped, and the fifth n-type semiconductor region 47, the primary working part, of the Hall generator 35 is contained, as seen in a plan view as in FIG. 1, inside the U-shaped current path, and so is to be acted upon by sufficient magnetic flux for high detection sensitivity.

6. The slits $11_a$–$11_f$, FIG. 8, are cut in the current-path conductor 4 to narrow the current path around the Hall generator 35, resulting in an increase in the magnetic flux acting effectively on the Hall generator despite use of the relatively large conductor for greater heat dissipation and mechanical strength.

7. Mounted to the sheet-metal mounting plate 21, the semiconductor chip 20 is thereby shielded from external fields.

8. The current-path conductor assembly 1 and the Hall generator assembly 2 are compactly united one on top of the other.

9. With the current detector separated into the current-path conductor assembly 1 and Hall generator assembly 2, the mounting plate 21 and leads 22–25 can be made thinner than the current-path conductor 4, and hence cheaper than if they were of the same thickness as the conductor.

10. The current-path conductor 4 and the Hall generator 35 are compactly combined mechanically in the completed current detector, making it easy for the current detector to be positioned and connected to the circuit to be tested.

11. The current-path conductor 4 and leads 22–25 project in opposite directions from the plastic casing 100, FIG. 1, constituted of the conductor holder 5 and Hall generator encapsulation 30. A high voltage withstanding capability is thus assured between current-path conductor 4 and leads 22–25, contributing to the improved reliability of the current detector. It is also an advantage of this conductor-and-leads arrangement that the pair of terminal portions $7_a$ and $8_a$ of the current-path conductor 4 are easily connectable to the circuit to be tested, possibly for the flow of large current, without interference by the leads 22–25.

Embodiment of FIGS. 15–20

Figure 15:
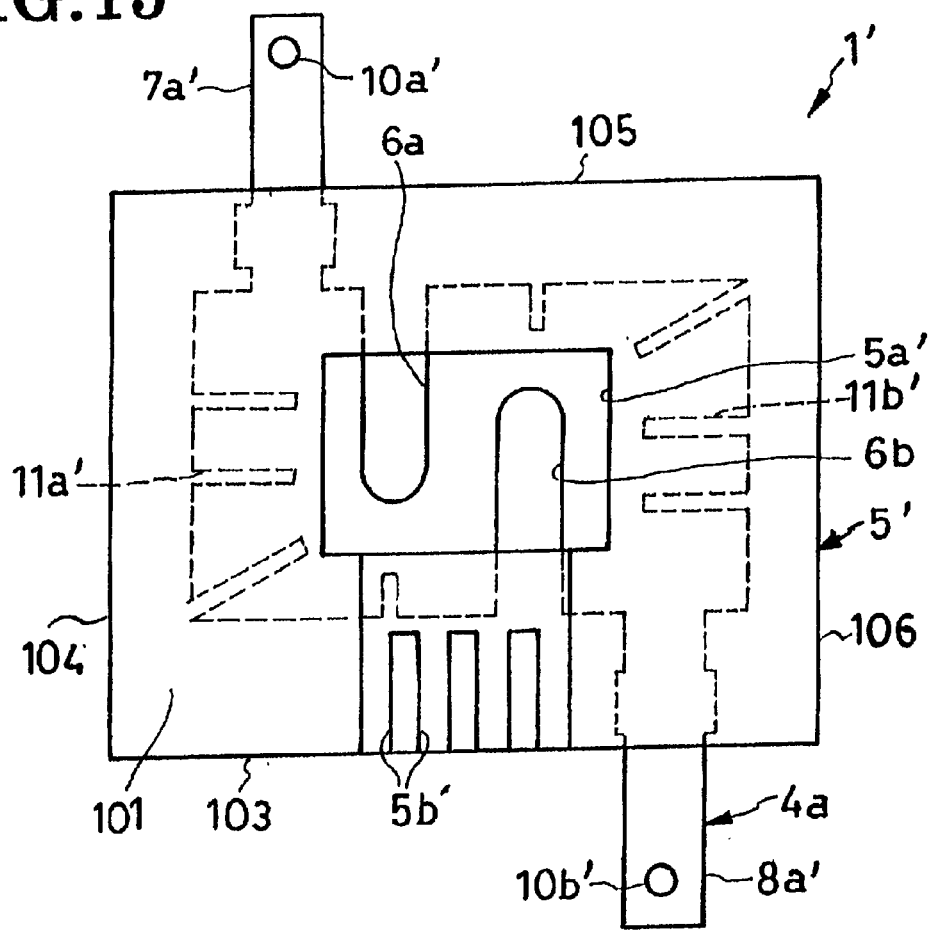
FIG. 15 is a plan view of a current-path conductor assembly of a second preferred form of current detector according to the invention which incorporates two Hall generators instead of one as in the FIGS. 1–14 current detector.
Figure 16:
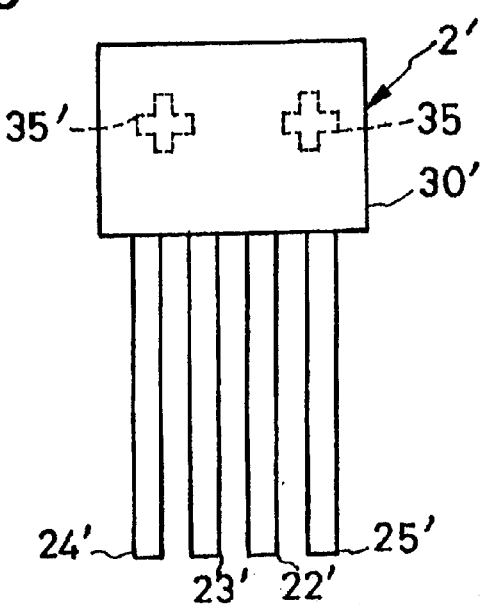
FIG. 16 is a plan view of a Hall generator assembly for use with the FIG. 15 current-path conductor assembly.

The current detector shown in these figures is a combination of a current-path conductor assembly 1', FIG. 15, and a Hall generator assembly 2', FIG. 16. The current-path conductor assembly 1' comprises a current-path conductor $4_a$, shown by itself in FIG. 17, and a conductor holder 5' of plastics material molded in one piece therewith. The Hall generator assembly 2' incorporates two Hall generators 35 and 35' of like construction, together with a plastic encapsulation 30' for both Hall generators 35 and 35', and four leads 22', 23', 24' and 25' extending therefrom.

Figure 17:
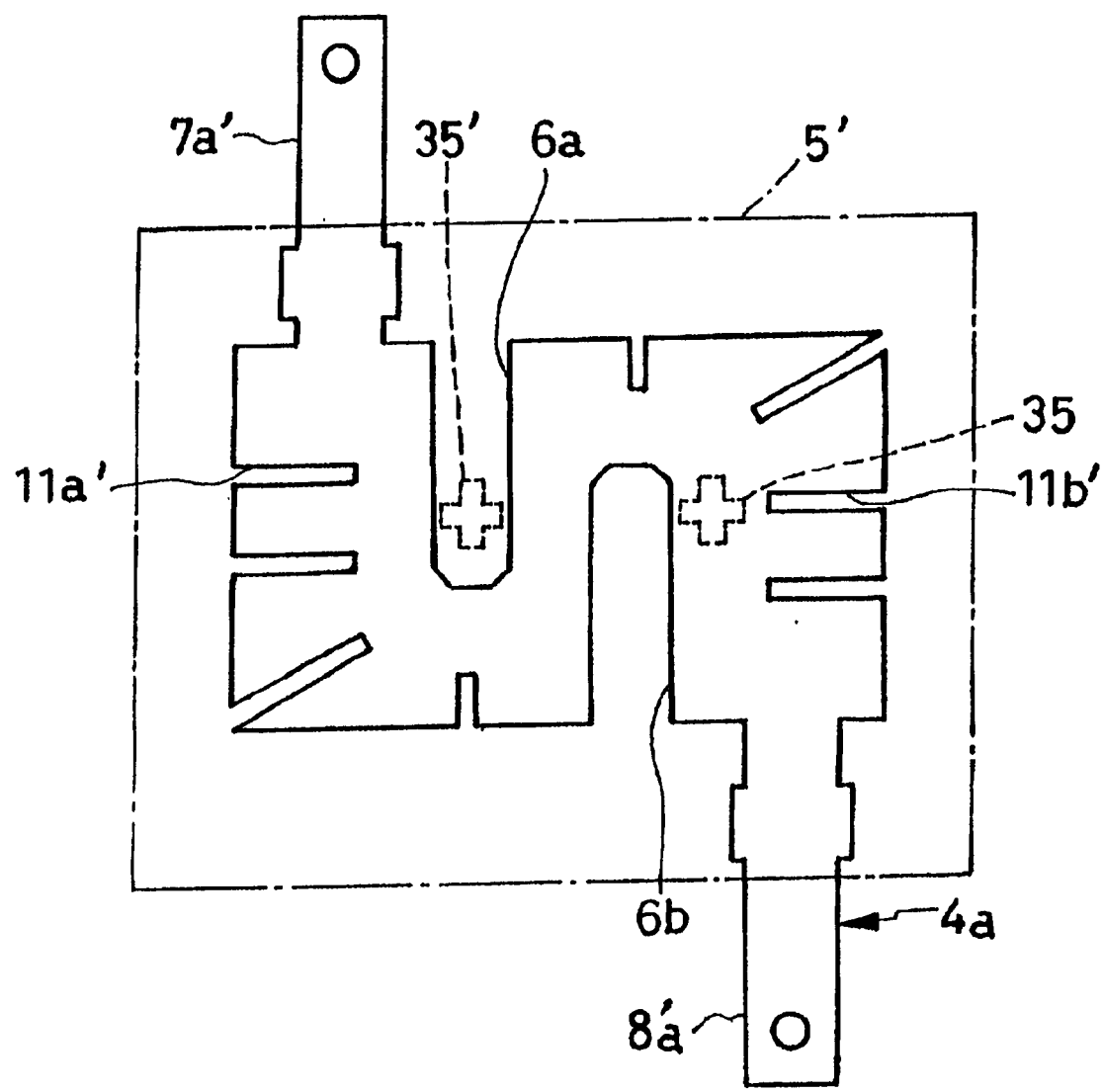
FIG. 17 is a plan view of the current-path conductor included the FIG. 5 current-path conductor assembly.
Figure 18:
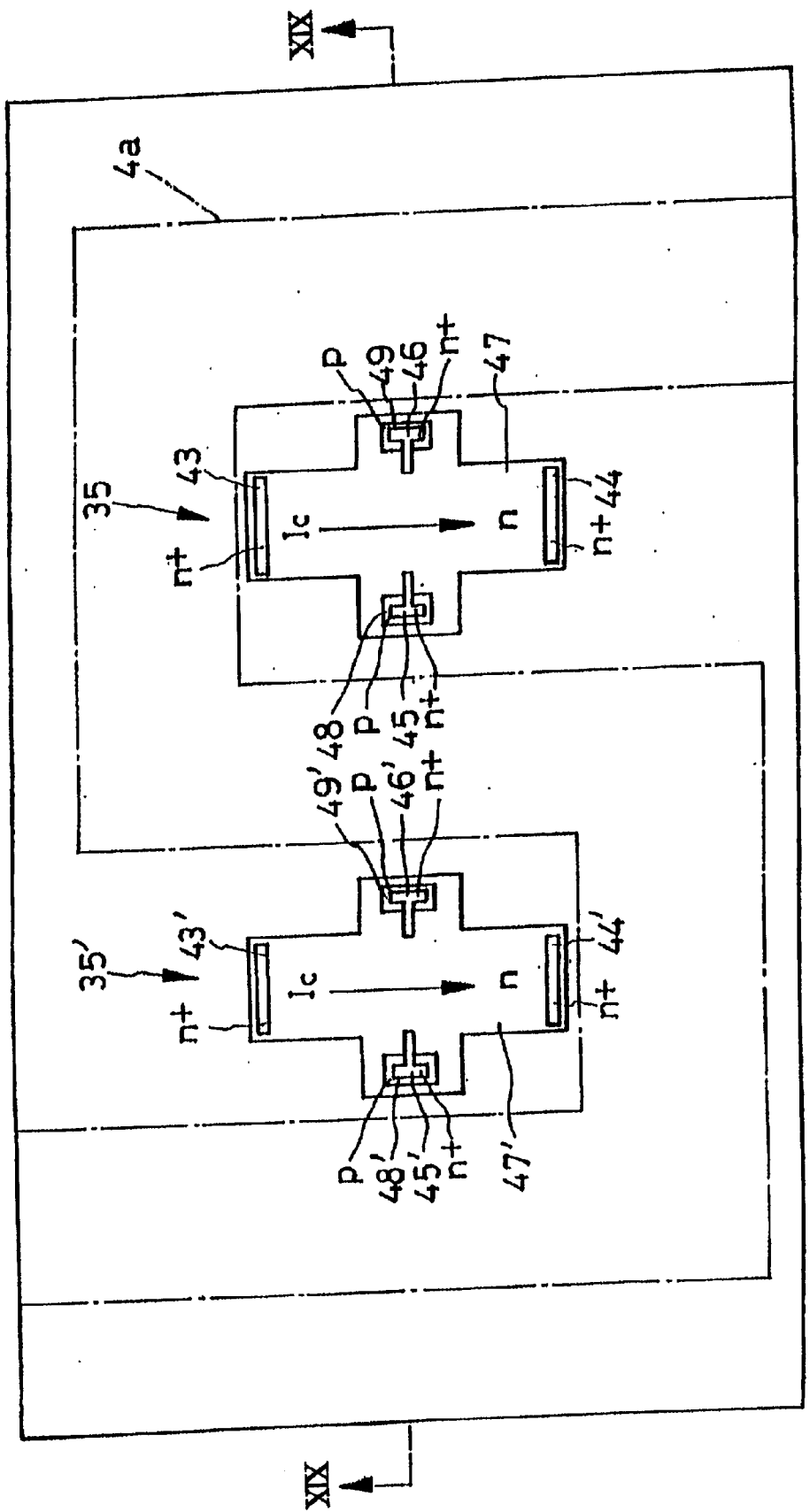
FIG. 18 is an enlarged plan view showing the two Hall generators of the FIG. 16 Hall generator assembly in relation to the S-shaped current path provided by the FIG. 17 current-path conductor.

Referring more specifically to FIG. 17, the current-path conductor $4_a$ of the current-path conductor assembly 1' is in the shape of a recumbent S, as seen in a plan view as in this figure, for use with the two Hall generators 35 and 35'. The current-path conductor $4_a$ is formed into the shape of an S by cutting two relatively wide slits or elongate openings $6_a$ and $6_b$ from its opposite edges in offset arrangement. The two Hall generators 35 and 35', or at least their primary working parts or fifth n-type semiconductor regions 47 and 47', are positioned in register with the slits $6_a$ and $6_b$. A plurality of, eight shown by way of example, narrower slits 60 are additionally cut in the current-path conductor $4_a$ from its outer edges to approximately half its width for constricting the current path toward the Hall generators 35 and 35'. The current-path conductor $4_a$ terminates at both ends in a pair of terminal portions $7_a'$ and $8_a'$ extending in opposite directions therefrom for connection to an electric circuit to be tested.

Figure 19:
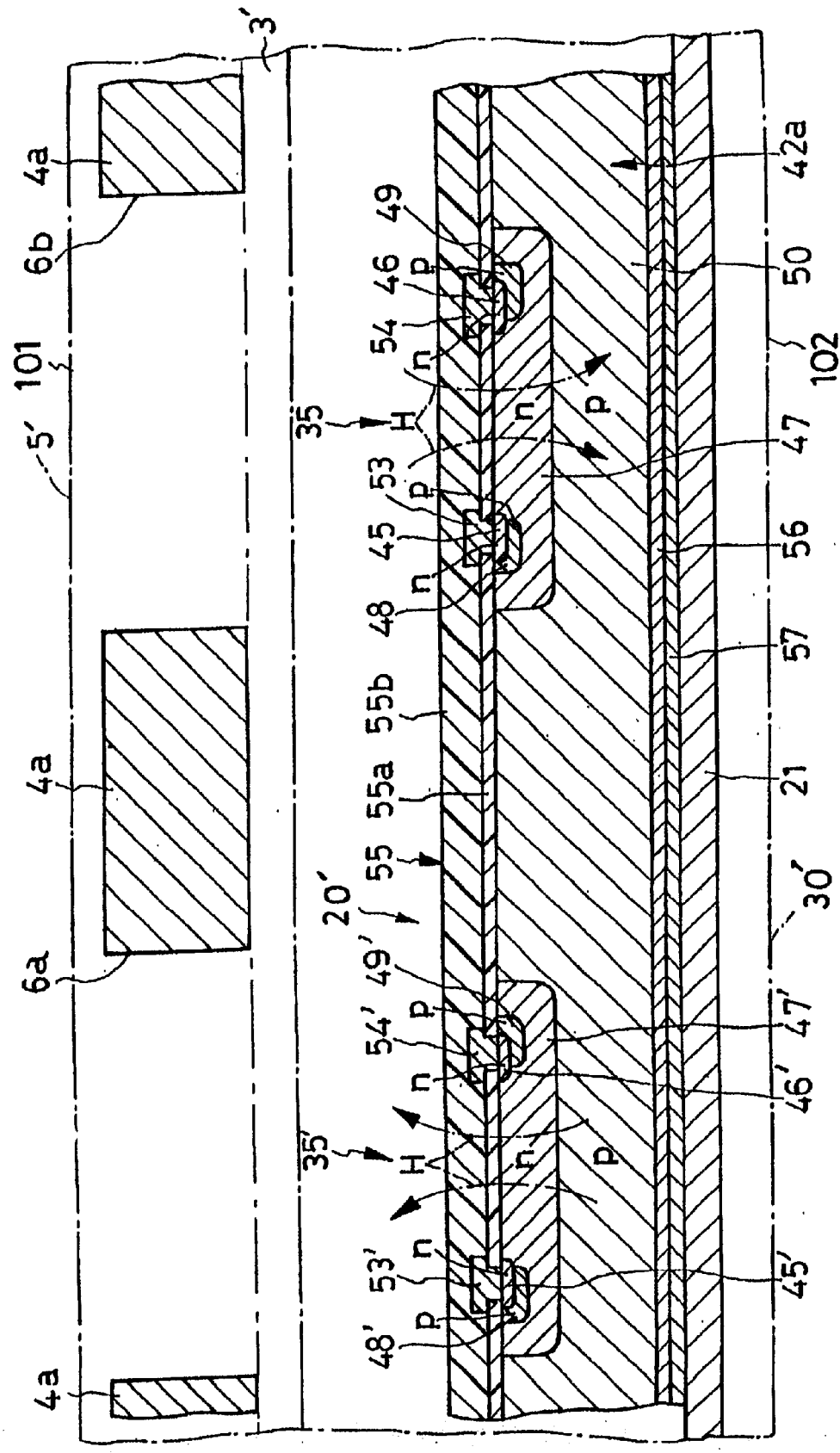
FIG. 19 is a still more enlarged, fragmentary section through the semiconductor chip including the two Hall generators of the FIG. 16 Hall generator assembly, the section being taken along the line XIX—XIX in FIG. 18.

The conductor holder 5' is in the shape of a six-sided solid having a pair of opposite major surfaces 101 and 102, FIGS. 15 and 19, and four side surfaces 103–106, FIG. 15. The terminal portion $7_a'$ of the current-path conductor $4_a$ projects from the side surface 105 of the conductor holder 5', and the other terminal portion $8_a'$ from the side surface 103. The major surface 101 of the conductor holder 5' has formed therein a positioning recess $5_a'$ for receiving the encapsulation 30' of the Hall generator assembly 2', and a set of elongate positioning recesses $5_b'$ for receiving parts of the leads 22'–25' of the Hall generator assembly. Although these leads 22'–25' and the current-path conductor terminal portion $8_a'$ both project from the same side surface 103 of the conductor holder 5', they are totally out of register with one another as seen in a plan view as in FIG. 15. FIG. 19 reveals at 3' the adhesive used for bonding the conductor holder 5' and the Hall generator encapsulation 30'.

As illustrated on an enlarged scale in FIG. 19, the two Hall generators 35 and 35' form parts of one and the same semiconductor chip 20' which is mounted to the metal-made mounting plate 21. A closer study of this figure will show that the two Hall generators 35 and 35' are of like construction. A comparison of FIG. 19 with FIG. 14 will further reveal that they are each of the same make as the Hall generator 35 of the FIGS. 1–14 embodiment. Thus, in FIG. 19, the various parts of the Hall generator 35 are identified by the same reference numerals as used to denote the corresponding parts of the FIG. 14 Hall generator 35, and the various parts of the other Hall generator 35' by priming the reference numerals designating their counterparts of the Hall generator 35.

As indicated by the arrows in FIG. 19, the magnetic fields H due to the current flowing through the S-shaped current-path conductor $4_a$ are opposite in direction for both Hall generators 35 and 35'.

Figure 20:
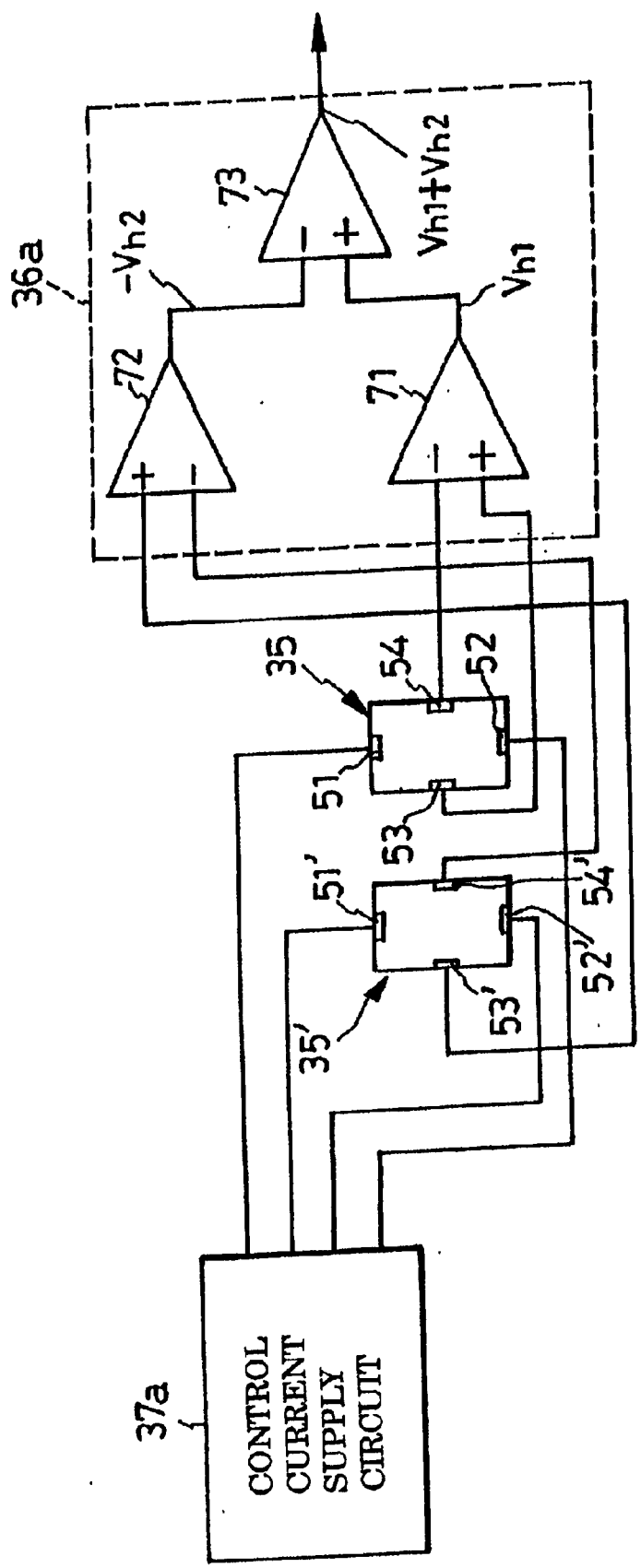
FIG. 20 is a schematic diagram of the electric circuitry of the FIGS. 15–19 current detector.

FIG. 20 shows the electrical circuitry of this current detector. The electrodes 51 and 52 of the first Hall generator 35 and the electrodes 51' and 52' of the second Hall generator 35' are all connected to the control current supply circuit $37_a$ of known design for the flow of the control current $I_c$, FIG. 18, through the Hall generators. In order to combine the output voltages of the two Hall generators 35 and 35' into a current detector output voltage indicative of the input current magnitude, there is provided an output circuit $36_a$ comprising three differential amplifiers 71, 72 and 73. The first differential amplifier 71 has its positive input connected to the third electrode 53 of the first Hall generator 35, and its negative input to the fourth electrode 54 of the first Hall generator. The second differential amplifier 72 has its positive input connected to the third electrode 53' of the second Hall generator 35', and its negative input to the fourth electrode 54' of the second Hall generator. The Hall voltages $V_{h1}$ and $-V_{h2}$ produced by the differential amplifiers 71 and 72 are therefore opposite in polarity.

The third differential amplifier 73 of the output circuit 36$_a$ has its positive input connected to the first differential amplifier 71, and its negative input to the second differential amplifier 72. The third differential amplifier 73 puts out the sum of the absolute values of the output voltages $V_{h1}$ and $-V_{h2}$ of the differential amplifiers 71 and 72 since $V_{h1}-(-V_{h2})=V_{h1}+V_{h2}$. This output from the third differential amplifier 73 could, however, be obtained by substituting an adder therefor and providing an inverter between the second differential amplifier 72 and the adder.

The two Hall generators 35 and 35' are both formed on the same semiconductor substrate 42$_a$. Here again, however, they could be formed as discrete units.

The current detector of FIGS. 15–20 gains the following advantages in addition to those enumerated in connection with that of FIGS. 1–14:

1. The sensitivity of current detection is made even higher as the absolute values of the Hall voltages from the two Hall generators 35 and 35' are added together to provide the current detector output voltage.
2. The two Hall generators 35 and 35' the midpart of the S-shaped current-path conductor 4$_a$ to keep the size of the conductor, and hence of the current detector, at a minimum.
3. Since the magnetic fields H acting on the two Hall generators 35 and 35' in juxtaposition are opposite in direction, the current detector output voltage is free from the effects of external magnetic field acting on both Hall generators. Let $V_0$ be the Hall voltage due to an external magnetic field applied to each Hall generator. Then the output from the first differential amplifier 71 will be $(V_{h1}+V_0)$, and that from the second differential amplifier 72 $(-V_{h2}+V_0)$. The output from the third differential amplifier 73 will therefore be: $V_{h1}+V_0-(-V_{h2}+V_0)=V_{h1}+V_{h2}$.

Figure 21:
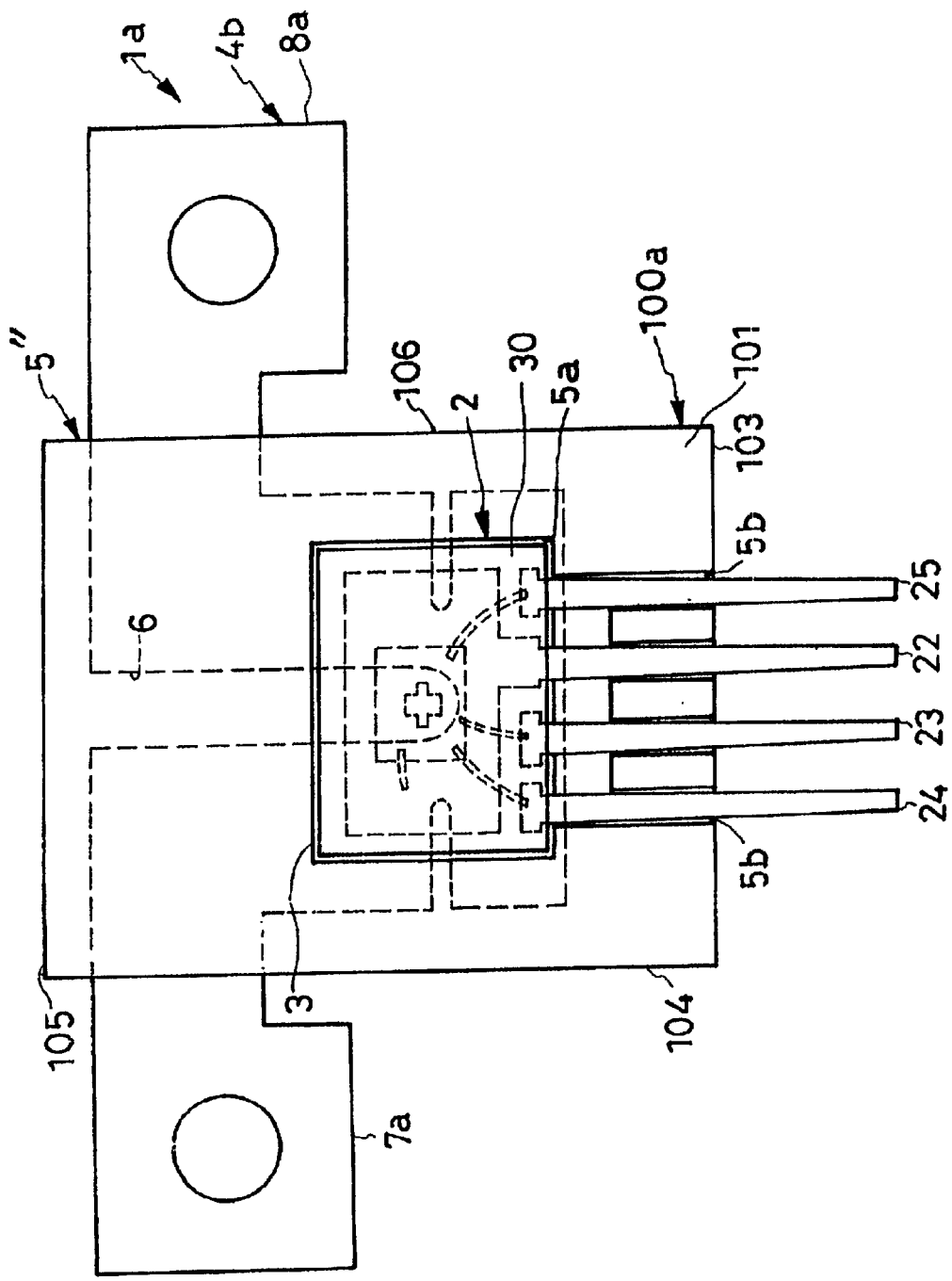
FIG. 21 is a plan view of a third preferred form of current detector according to the invention having a current-path conductor with a pair of terminal portions extending in opposite directions.

Embodiment of FIG. 21

The FIG. 21 current detector is a combination of a modified current-path conductor assembly 1$_a$ and the original Hall generator assembly 2 of the FIGS. 1–14 construction. The modified current-path conductor assembly 1$_a$ comprises a modified sheet-metal current-path conductor 4$_b$ and a modified conductor holder 5". The current-path conductor 4$_b$ has a pair of terminal portions 7$_a$ and 8$_a$ which are bent right-angularly in opposite directions from the rest of the parallel limbs of the conductor. The conductor holder 5" integrally envelops all but the terminal portions 7$_a$ and 8$_a$ of the current-path conductor 4$_b$, with these terminal portions projecting in opposite directions from the side surfaces 104 and 106 of the conductor holder 5", or of the casing 100$_a$ constituted of the conductor holder 5" and Hall generator encapsulation 30 bonded together. The four leads 22–25 of the Hall generator assembly 2 all extend from the side surface 103 of the casing 100$_a$, as in the FIGS. 1–14 embodiment, and so are sufficiently spaced from the current-path conductor terminal portions 7$_a$ and 8$_a$, possibly giving rise to no handling trouble in use.

The FIG. 21 current detector offers the following advantages other than those set forth in conjunction with the FIGS. 1–14 embodiment:

1. The pair of current-path conductor terminal portions 7$_a$ and 8$_a$ are so spaced from each other that they are easier of connection to the circuit to be tested.

2. Separated from each other by the conductor holder 5", the pair of current-path conductor terminal portions 7$_a$ and 8$_a$ are free from the danger of shorting.

Figure 22:
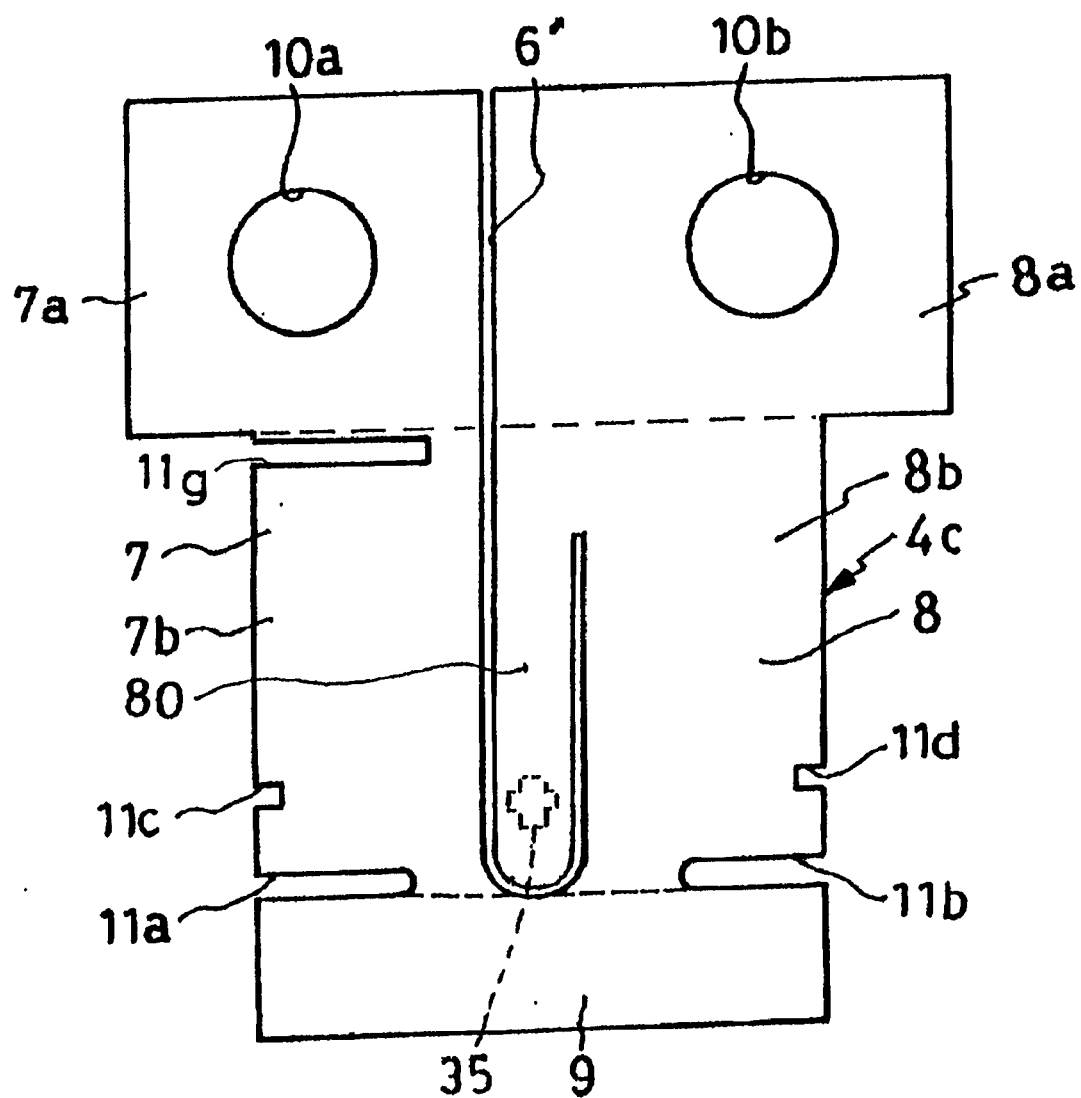
FIG. 22 is a plan view of another modified current-path conductor having a J-shaped slit.

Embodiment of FIG. 22

Another modified current-path conductor 4$_c$ of FIG. 22 features a narrow, J-shaped slit 6' in substitution for the broader, straight slit 6 of the FIGS. 1–14 embodiment, and an additional slit 11$_g$. This modified current-path conductor 4$_c$ is to be combined with the plastic conductor holder, not shown here, of the same construction as in FIGS. 1–14, and the resulting current-path conductor assembly is to be combined with the Hall-generator assembly, also not shown here, of the same construction as in FIGS. 1–14.

The current detector including the FIG. 22 current-path conductor 4$_c$ has the Hall generator 35 positioned as indicated by the dashed outline in this figure. It will be noted that the Hall generator 35 is in register with that part 80 of the current-path conductor 4$_c$ which is bounded by the curvature of the J-shaped slit 6' therein. This part 80, absent from the FIGS. 1–14 current-path conductor 4, functions both as a shield against noise and as a heat dissipater. The additional slit 11$_g$ is shown formed at the boundary between the terminal portion 7$_a$ and current-path portion 7$_b$ of the conductor limb 7. This slit 11$_g$ is intended to make the current-path conductor 4 fusible on carrying a particular value of overload current. The electric circuit connected to the current-path conductor 4 is protected from overload current as the conductor is fusible at the slit 11$_g$.

Figure 23:
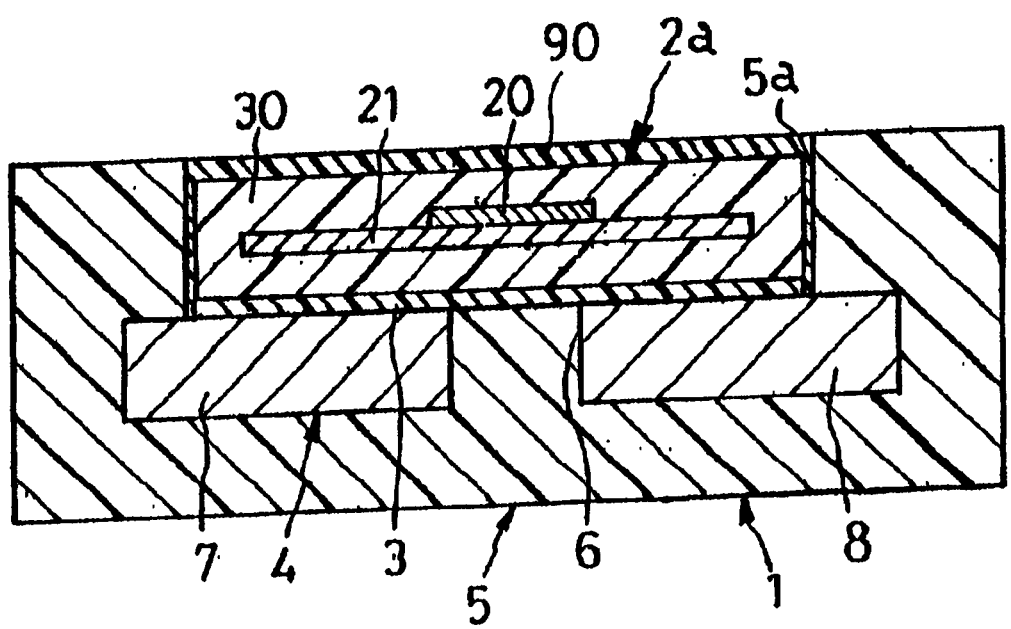
FIG. 23 is a view similar to FIG. 3 but showing a slight modification of the FIGS. 1–14 current detector.

Embodiment of FIG. 23

A Hall generator assembly 2$_a$ of slightly modified construction is incorporated with the current-path conductor assembly 1 of the FIGS. 1–14 construction in the current detector shown in FIG. 23. This figure shows the same section of the current detector under consideration as that of the FIG. 1 current detector revealed by FIG. 3. It will therefore be noted that the modified Hall generator assembly 2$_a$ has the semiconductor chip 20 mounted to that surface of the metal-made mounting plate 21 which is directed away from the current-path conductor 4. Stated conversely, the mounting plate 21 is interposed between current-path conductor 4 and semiconductor chip 20 to function as an electrostatic shield for the Hall generator.

Figure 24:
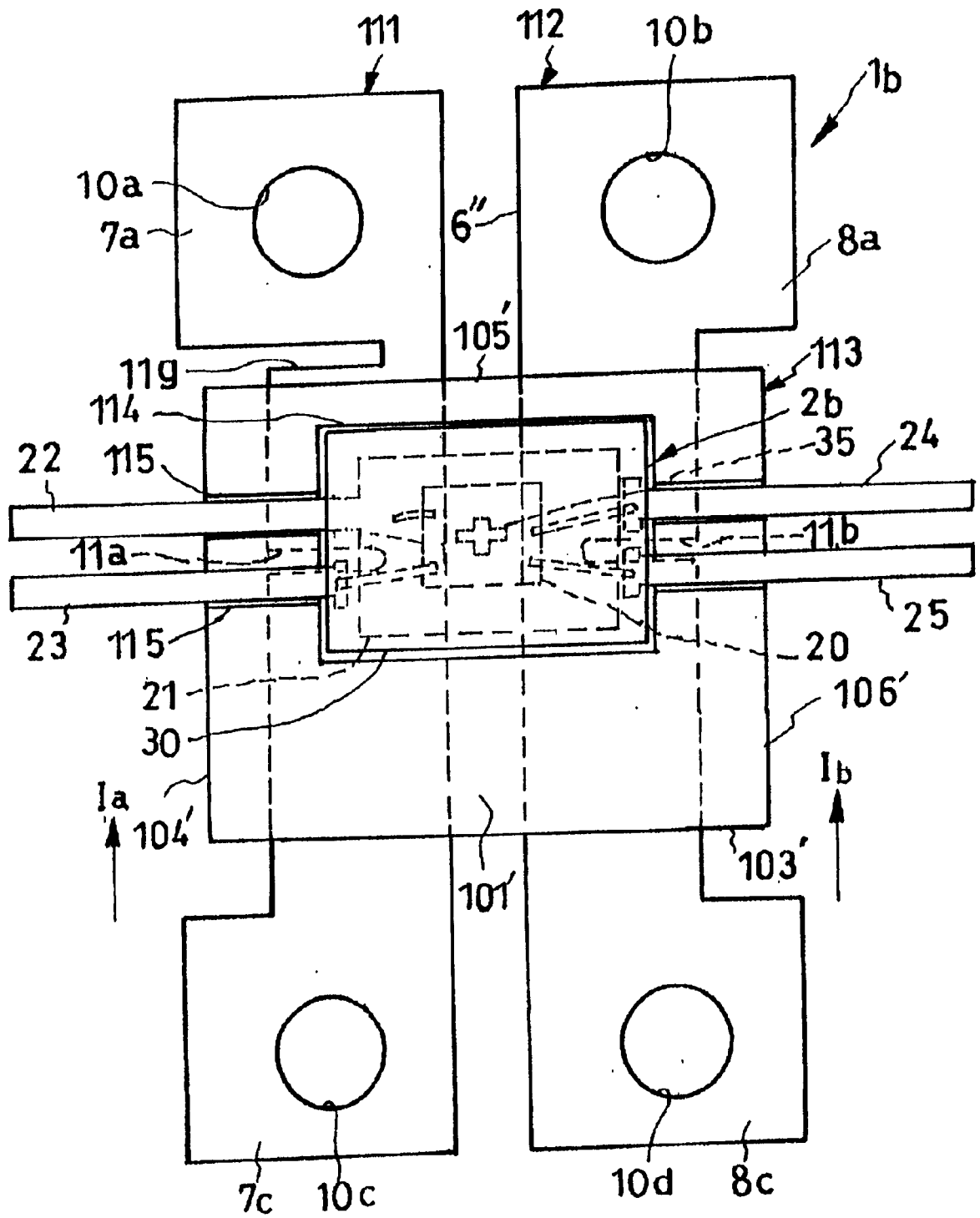
FIG. 24 is a plan view of a further preferred form of current detector according to the invention having a pair of current-path conductors instead of one as in all the foregoing embodiments.
Figure 25:
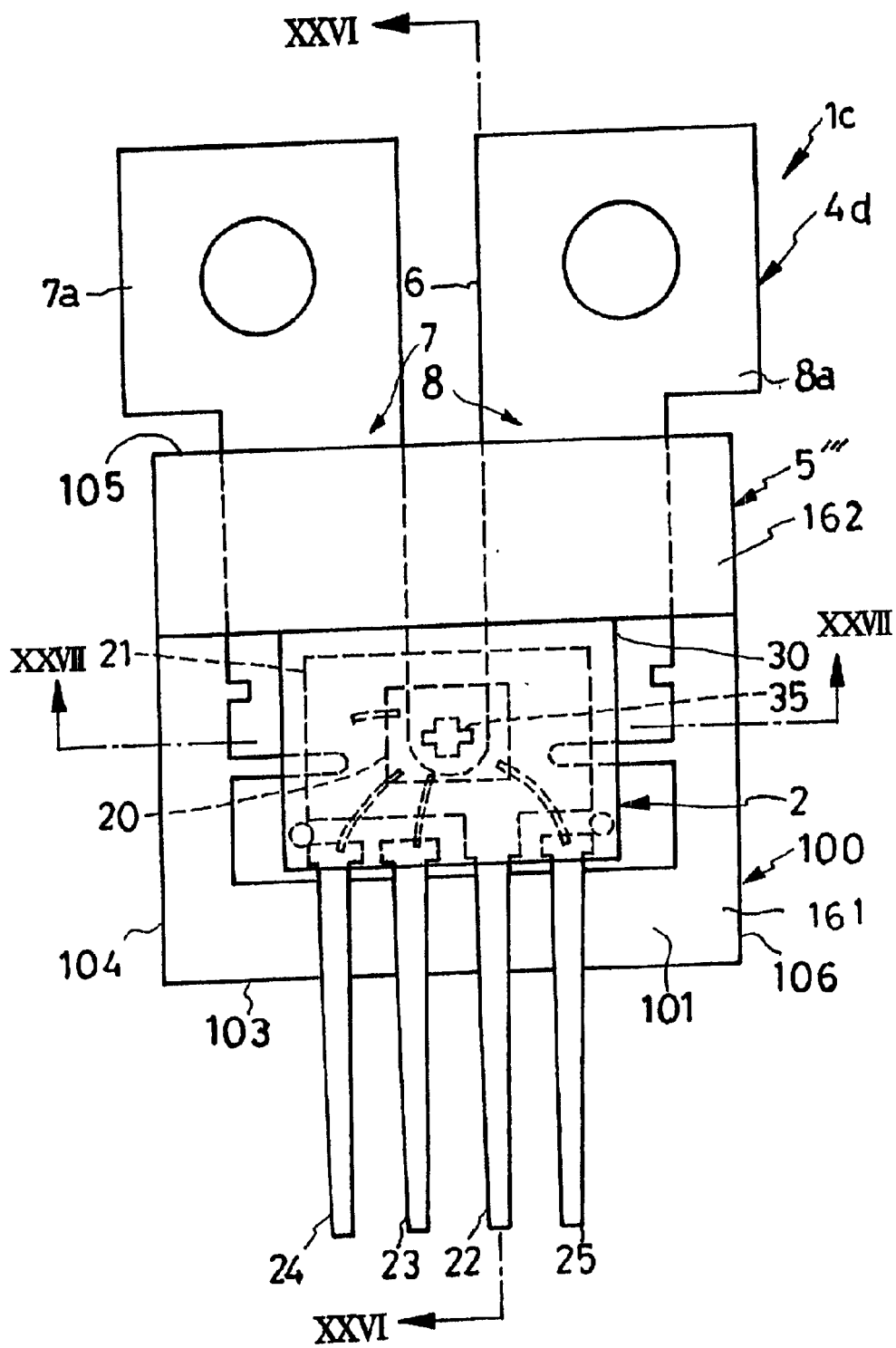
FIG. 25 is a plan view of a modified current detector according to the present invention.
Figure 26:
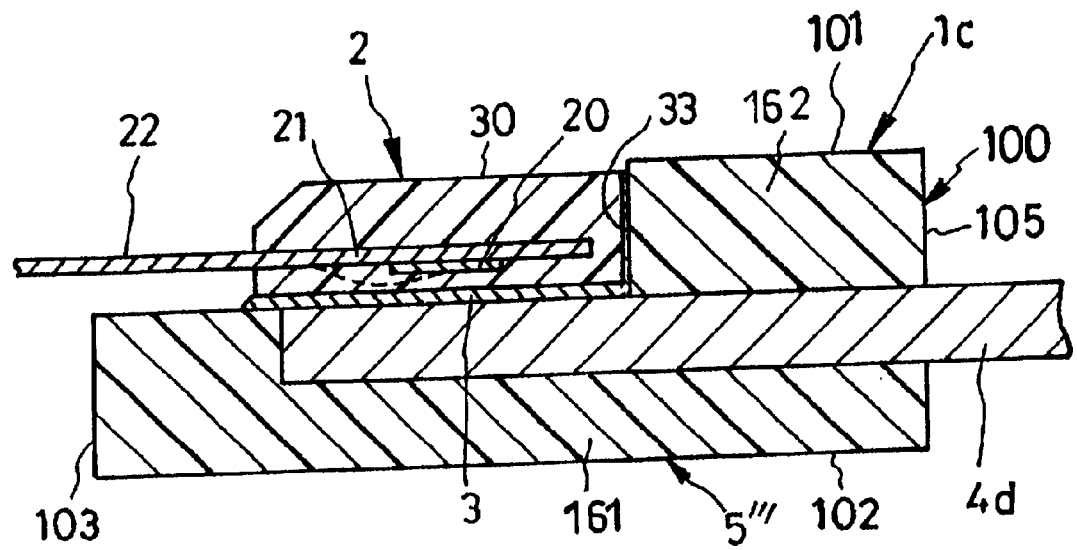
FIG. 26 us a section through the modified current detector taken along the line XXVI—XXVI in FIG. 25.
Figure 27:
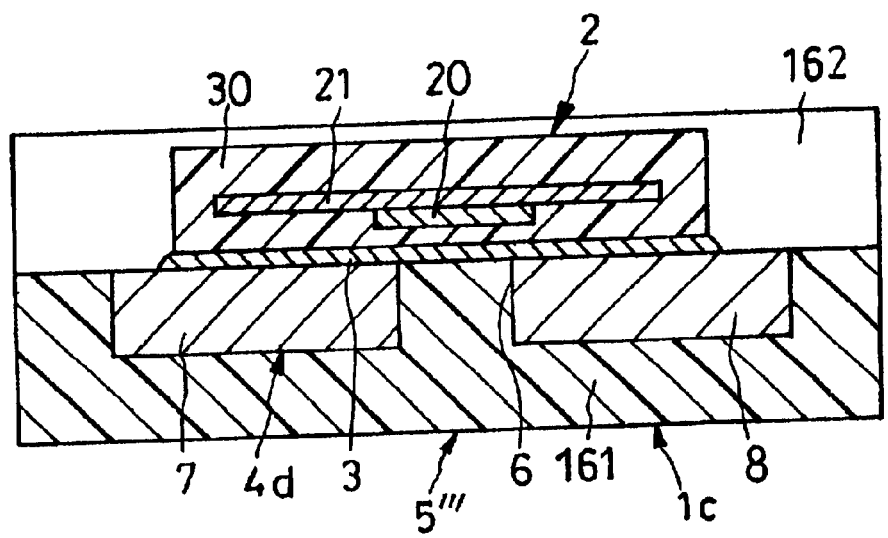
FIG. 27 is another section through the modified current detector taken along the line XXVII—XXVII in FIG. 25.

Embodiment of FIG. 24

In FIG. 24 is shown the current detector as adapted specifically for detection of current leakage. The current leakage detector comprises a modified current-path conductor assembly 1$_b$ and a modified Hall generator assembly 2$_b$. The current-path conductor assembly 1$_b$ includes a pair of elongate sheet-metal current-path conductors 111 and 112 for ease of detection of current leakage. A molded plastic conductor holder 113, another component of the current-path conductor assembly 1$_b$, is formed in one piece with the current-path conductors 111 and 112, holding them parallel to each other with a spacing 6" therebetween which is similar to the slit 6 in the unitary current-path conductor 4 of the FIGS. 1–14 embodiment. The Hall generator 35 of the Hall generator assembly 2$_b$ is disposed in register with this spacing 6" between the current-path conductors 111 and 112 as seen in a plan view as in this figure.

The pair of current-path conductors 111 and 112 terminate in a first pair of terminal portions 7$_a$ and 8$_a$, each at one end, and in a second pair of such portions 7$_c$ and 8$_c$ each at the other end, either for mutual interconnection or for connection to an external circuit. Connection holes 10$_a$ and 10$_b$ are cut in the first pair of terminal portions 7$_a$ and 8$_a$, and similar holes 10$_c$ and 10$_d$ in the second pair of terminal portions 7$_c$ and 8$_c$. The two pairs of terminal portions project in opposite directions from the conductor holder 113.

Generally boxlike in shape, the conductor holder 113 has formed therein positioning recesses 114 and 115 for receiving the encapsulation 30 and leads 22–25, respectively, of the Hall generator assembly 2$_b$ in prescribed positional relationship to the pair of current-path conductors 111 and 112. It is understood that, so positioned on the conductor holder 113, the Hall generator assembly 2$_b$ is bonded to the conductor holder in the same manner as set forth in connection with FIGS. 1–14 embodiment.

The Hall generator assembly 2$_b$ is similar to its FIGS. 1–14 counterpart 2 except that the two leads 22 an 23 project from one side, and the other two leads 24 and 25 from the opposite side, of the Hall generator encapsulation 30. Received in parts in the positioning recesses 115 in the conductor holder 113, the two pairs of leads 22–25 project from the opposite side surfaces 104' and 105' of the conductor holder 113. The first pair of terminal portions 7$_a$ and 8$_a$ of the current-path conductors 111 and 112 project from the side surface 105' of the conductor holder 113, and the second pair of terminal portions 7$_c$ and 8$_c$ from the side surface 103' of the conductor holder 113.

In use of the FIG. 24 embodiment as a current leakage detector, the pair of current-path conductors 111 and 112 may be serially connected respectively to the pair of power conductors, not shown, to be tested, in such a way that the currents I$_a$ and I$_b$ flow in the same direction through the conductors 111 and 12, as indicated by the arrows in FIG. 24. The currents I$_a$ and I$_b$ will be of the same magnitude if there is no leakage. The Hall generator 35 will produce no voltage when the currents I$_a$ and I$_b$ are of the same magnitude, since the magnetic fluxes due to the currents I$_a$ and I$_b$ act on the Hall generator in opposite directions. In event a current leakage does occur, however, the currents I$_a$ and I$_b$ will be unequal in magnitude, so that the Hall generator 35 will put out a voltage in proportion with the magnitude of the leaking current.

The FIG. 24 embodiment lends itself to use as a current balance detector as well. The Hall voltage proportional to the difference between two currents 1$_a$ and I$_b$ to be measured will be produced as such currents are made to flow through the pair of current path conductors 111 and 112. Still further the FIG. 24 device is readily adaptable for use in the same manner as that of FIGS. 1–14 as the pair of current-path conductors 111 and 112 provide the U-shaped current path as its terminal portions 7$_c$ and 8$_c$, for instance, are electrically interconnected. Being comprised of the current-path conductor assembly 1$_b$ and the Hall generator assembly 2$_b$ which are readily composed in prescribed positional relationship, the FIG. 24 device possesses the same advantages as set forth in conjunction with the first disclosed embodiment.

Embodiment of FIGS. 25–29

The current detector of FIGS. 25–29 features a modified current-path conductor assembly 1$_c$, and is identical with the FIGS. 1–14 current detector in all the other details of construction. The modified current-path conductor assembly 1$_c$ comprises a modified sheet-metal current-path conductor 4$_d$ and a modified conductor holder 5'''.

The modified sheet-metal current-path conductor 4$_d$ features holes 12$_a$ and 12$_b$ for firmer coupling of the current-path conductor 4$_d$ with the holder 5''', and is identical with the FIG. 8 current-path conductor 4 in all the other details of construction.

The modified conductor holder 5''' is designed for mechanically supporting and electrically insulating the current-path conductor 4$_d$, as well as for positioning the Hall generator assembly 2 with respect to the conductor 4$_d$ in putting together the current-path conductor assembly 1$_c$ and Hall generator assembly 2. Toward these ends the modified conductor holder 5''' comprises a first portion 161, FIGS. 27–29, and a second portion 162. The first portion 161 overlies most of the midportions 7$_b$ and 8$_b$ of the conductor limbs 7 and 8 and all of the proximal portions 7$_c$ and 8$_c$ of the conductor limbs 7 and 8 and of the conductor bight 9, all on one side the current-path conductor 4$_d$. The second portion 162 of the conductor holder 5''' overlies most of the midportions 7$_b$ and 8$_b$ of the conductor limbs 7 and 8 on the other side of the current-path conductor 4$_d$. The two portions 161 and 162 of the conductor holder 5''' are formed in one piece by the familiar transfer molding method.

The first portion 161 of the conductor holder 5''', which includes parts filling the noted slits and holes in the conductor limb proximal portions 7$_c$ and 8$_c$ and the conductor bight 9, functions mostly to mechanically support and electrically insulate the current-path conductor 4$_d$. That part of the conductor holder first portion 161 which underlies the conductor 4$_d$ is made less in thickness than the conductor holder second portion 162 for greater heat dissipation. The conductor holder second portion 162 functions as a guide or abutment in mounting the Hall generator assembly 2 on the current-path conductor assembly 1$_c$, as will be understood from FIGS. 26 and 28, and as a reinforcement for the conductor limbs 7 and 8.

Figure 28:
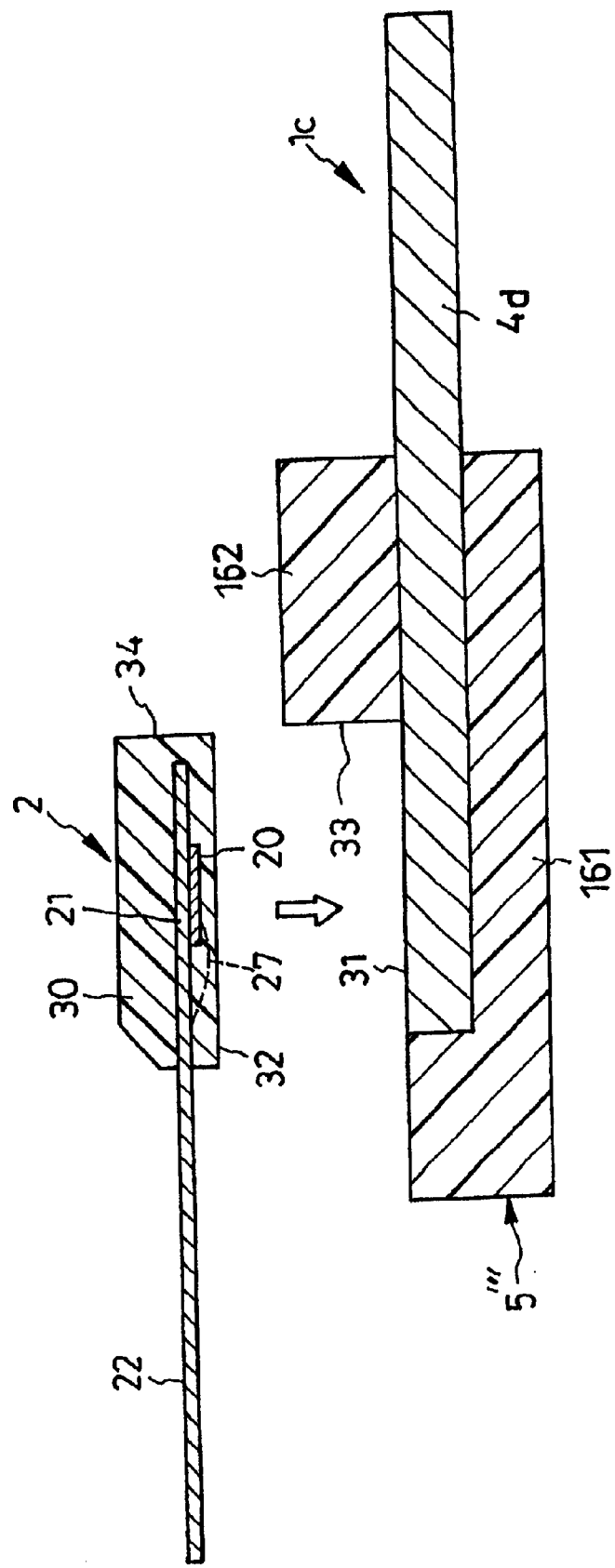
FIG. 28 is a view similar to FIG. 26 except that the current detector is shown divided into the Hall generator assembly and the current-path conductor assembly.
Figure 29:
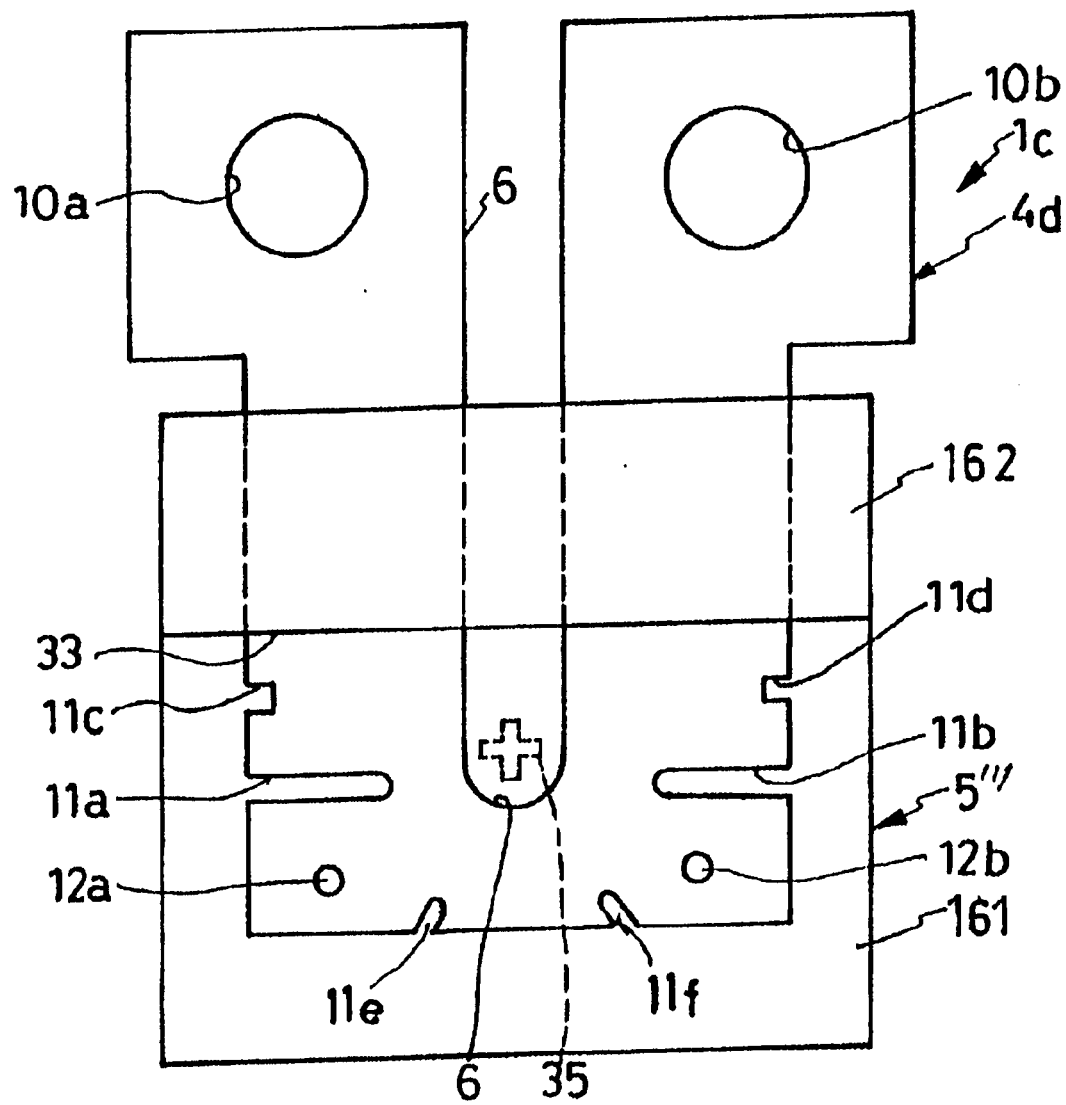
FIG. 29 is a plan view of the current-path conductor assembly shown in FIG. 28.

As indicated in FIG. 28, the encapsulation 30 of the Hall generator assembly 2 is generally box-shaped, including a major surface 32 held against the exposed surface portion 31 of the current-path conductor 4$_d$ of the current-path conductor assembly 1$_c$, and a side surface 34 held against the abutment 33 provided by the second portion 162 of the conductor holder 5'''. The current-path conductor assembly 1$_c$ and the Hall generator assembly 2 are bonded together by the adhesive layer 3, FIG. 26, between the surface portion 31 of the current-path conductor 4$_d$ and the major surface 32 of the Hall generator encapsulation 30 by another such layer between the abutment 33 of the conductor holder 5''' and the side surface 34 of the Hall generator encapsulation 30. Thus, as the plastic conductor holder 5''' and Hall generator encapsulation 30 are integrally joined together as above, so are the current-path conductor assembly 1$_c$ and Hall generator assembly 2, completing the current detector as in FIGS. 25–27.

Figure 30:
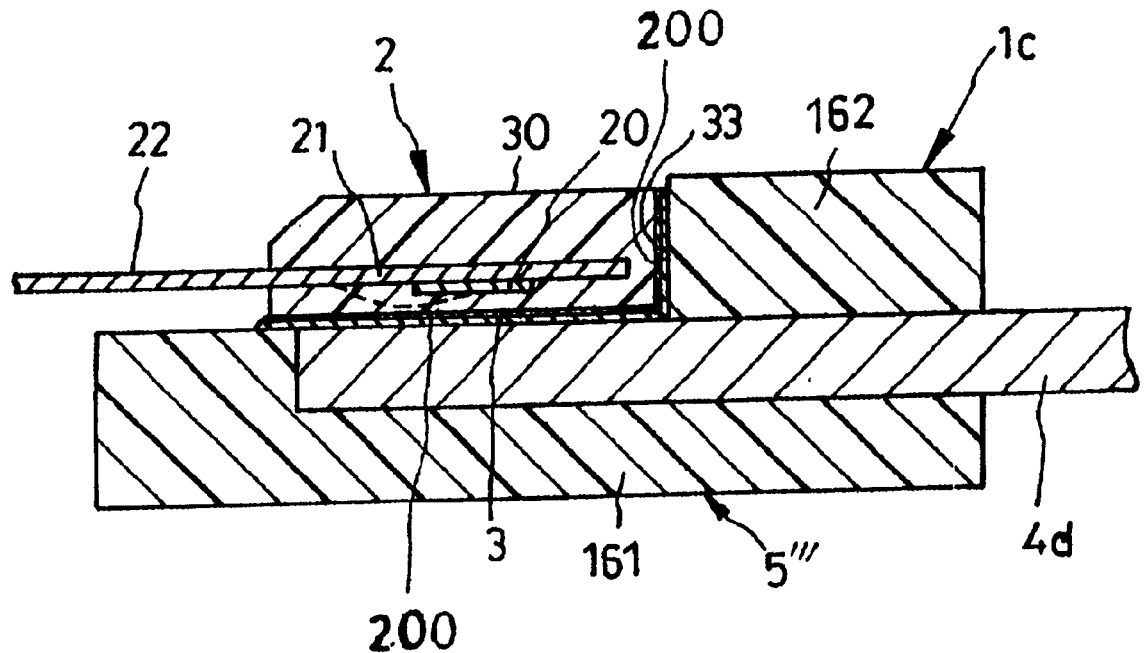
FIG. 30 is a view similar to FIG. 26 but showing a slight modification of the FIGS. 25–29 current detector.
Figure 31:
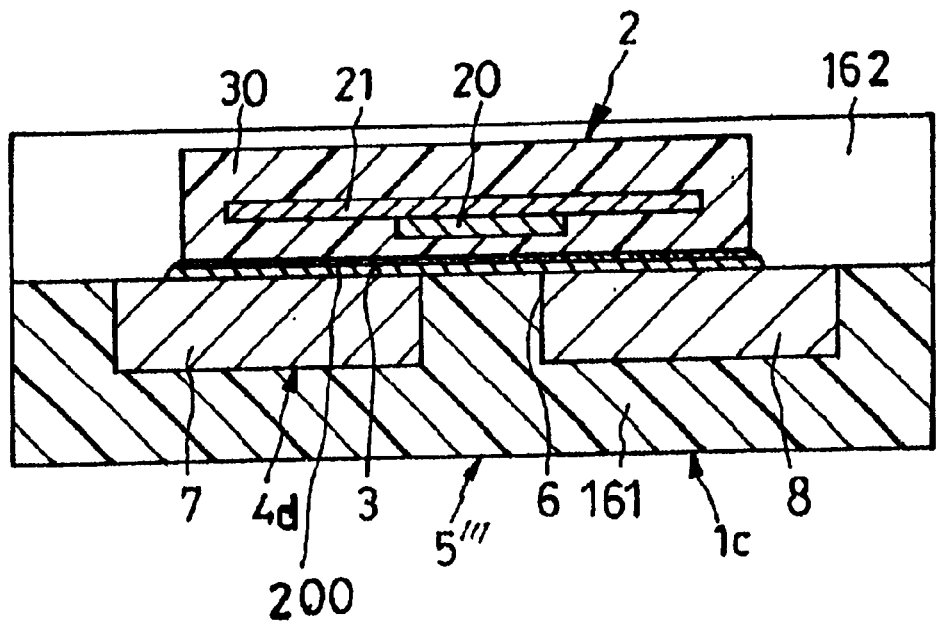
FIG. 31 is a view similar to FIG. 27 but showing the modified current detector of FIG. 30.

Embodiment of FIGS. 30 and 31

The current detector shown in these figures features a sheet or layer 200 of electrically insulating material interposed between current-path conductor assembly 1$_c$ and Hall generator assembly 2 which are themselves of the same construction as those of FIGS. 25–29. More specifically, the insulating layer 200 is bonded or otherwise formed substantially in one piece with the plastic encapsulation 30 of the Hall generator assembly 2 and bonded to the current-path assembly 1$_c$ via the adhesive layer 3. Fabricated from a material that is more electrically insulating than the encapsulation 30, the insulating layer 200 conduces to enhancement of insulation between current-path conductor 4$_d$ and semiconductor chip 20. The insulating layer 200 could be provided only between current-path conductor $4_d$ and semiconductor chip 20 or thereabouts.

Although the current detector according to the invention has been shown and described hereinbefore in terms of several preferred forms thereof, it is not desired that the present invention be limited by the exact details of the drawings or by the description thereof. For instance, in the FIG. 23 embodiment, a magnetic collector could be provided above the Hall generator chip 20. This and a variety of other modifications, alterations and adaptations of the illustrated embodiments will suggest themselves to one skilled in the art within the scope of the present invention as expressed in the claims which follow.

What is claimed is:

1. A current detector utilizing the Hall-effect for detection or measurement of electric current, comprising:
   (A) a current-path conductor assembly comprising:
      (a) a current-path conductor for carrying the current to be detected or measured; and
      (b) a conductor holder of electrically insulating material integrally enveloping part of the current-path conductor, the conductor holder having a positioning recess;
   (B) a Hall generator assembly comprising:
      (a) a Hall generator for generating a Hall voltage proportional to the strength of an applied magnetic field;
      (b) a plurality of leads electrically connected to the Hall generator; and
      (c) an encapsulation of electrically insulating material integrally enveloping the Hall generator and parts of the leads, the encapsulation having a size which can be put into the positioning recess; and
   (C) the current-path conductor assembly and the Hall generator assembly being combined by joining together the conductor holder of the current-path conductor assembly and the encapsulation of the Hall generator assembly, with the current-path conductor disposed adjacent the Hall generator in order to cause the Hall generator to generate the Hall voltage in response to a magnetic field due to the current flowing through the current-path conductor, the encapsulation being put into the positioning recess of the conductor holder.

2. The current detector of claim 1 wherein the conductor holder of the current-path conductor assembly has formed therein an additional set of positioning recesses for receiving the leads of the Hall generator assembly.

3. The current detector of claim 1 wherein the current-path conductor of the current-path conductor assembly is partly exposed through the positioning recess in the conductor holder.

4. The current detector of claim 1 wherein the current-path conductor of the current-path conductor assembly is a piece of sheet metal having a slit formed therein to provide a U-shaped current path, and wherein the positional relationship is such that the Hall generator is contained in the slit as seen in a direction normal to the plane of the sheet-metal current-path conductor.

5. The current detector of claim 4 wherein the current-path conductor of the current-path conductor assembly has additional slits formed therein to constrict the current path toward the Hall generator.

6. The current detector of claim 1 wherein the Hall generator assembly further comprises a metal-made mounting plate to which the Hall generator is mounted, the mounting plate being enveloped by the encapsulation.

7. The current detector of claim 6 wherein the mounting plate has a surface held opposite the current-path conductor, and wherein the Hall generator is mounted to said surface of the mounting plate.

8. The current detector of claim 6 wherein the mounting plate has a first surface held opposite the current-path conductor, and wherein the Hall generator is mounted to a second surface, which is directed away from the current-path conductor, of the mounting plate.

9. The current detector of claim 1 wherein the current-path conductor is formed to include a pair of terminal portions projecting from the casing for connection to an external circuit, the terminal portions being out of register with the leads.

10. The current detector of claim 9 wherein the pair of terminal portions of the current-path conductor project in the same direction from the casing.

11. The current detector of claim 9 wherein the pair of terminal portions of the current-path conductor project in opposite directions from the casing.

12. The current detector of claim 1 wherein the encapsulation of the Hall generator assembly and the conductor holder of the current-path conductor assembly are bonded together via a sheet of electrically insulating material.

13. A method for the manufacture of a current detector utilizing the Hall-effect for detection or measurement of electric current, comprising:
   (A) providing a current-path conductor assembly comprising:
      (a) a current-path conductor for carrying the current to be detected or measured; and
      (b) a conductor holder of electrically insulating material integrally enveloping part of the current-path conductor, the conductor holder having a positioning recess;
   (B) providing a Hall generator assembly comprising:
      (a) a Hall generator for generating a Hall voltage proportional to the strength of an applied magnetic field;
      (b) a plurality of leads electrically connected to the Hall generator; and
      (c) an encapsulation of electrically insulating material integrally enveloping the Hall generator and parts of the leads, the encapsulation having a size which can be put in to the positioning recess; and
   (C) putting the encapsulation into the positioning recess, and bonding the encapsulation with the conductor holder.

* * * * *